(12) United States Patent
Lu

(10) Patent No.: US 11,217,520 B2
(45) Date of Patent: Jan. 4, 2022

(54) WIRING STRUCTURE, ASSEMBLY STRUCTURE AND METHOD FOR MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 96 days.

(21) Appl. No.: 16/709,641

(22) Filed: Dec. 10, 2019

(65) Prior Publication Data

US 2021/0175164 A1    Jun. 10, 2021

(51) Int. Cl.
*H01L 23/498* (2006.01)
*H01L 21/48* (2006.01)
*H01L 23/00* (2006.01)

(52) U.S. Cl.
CPC ...... *H01L 23/49838* (2013.01); *H01L 21/486* (2013.01); *H01L 21/4857* (2013.01); *H01L 23/49822* (2013.01); *H01L 23/49827* (2013.01); *H01L 23/562* (2013.01)

(58) Field of Classification Search
CPC ......... H01L 23/49838; H01L 23/49822; H01L 23/49827; H01L 21/4857; H01L 21/486; H01L 23/5384; H01L 2224/08165; H01L 2224/16165; H01L 2224/16235; H01L 2224/32165; H01L 2224/32235; H01L 2224/40165; H01L 2224/40235; H01L 2224/48165; H01L 2224/48235; H01L 23/5226; H01L 23/528; H01L 23/53295
See application file for complete search history.

(56) References Cited

U.S. PATENT DOCUMENTS

| | | | |
|---|---|---|---|
| 6,407,458 B1 * | 6/2002 | Huemoeller | H01L 23/49816 257/774 |
| 10,096,571 B2 | 10/2018 | Yu et al. | |
| 2009/0115056 A1 * | 5/2009 | Saitou | H01L 24/81 257/737 |
| 2013/0228897 A1 * | 9/2013 | Chen | H01L 23/49816 257/621 |
| 2019/0287930 A1 * | 9/2019 | Tsuchida | H01L 23/49822 |
| 2020/0168536 A1 * | 5/2020 | Link | H01L 23/645 |
| 2021/0057296 A1 * | 2/2021 | Morita | H01L 25/00 |
| 2021/0183782 A1 * | 6/2021 | Yasukawa | H01L 23/49838 |

\* cited by examiner

*Primary Examiner* — Scott B Geyer
(74) *Attorney, Agent, or Firm* — Foley & Lardner LLP

(57) ABSTRACT

A wiring structure includes a first dielectric layer, a first circuit layer, a second dielectric layer and a conductive via. The first dielectric layer defines at least one through hole. The first circuit layer is disposed on the first dielectric layer. The second dielectric layer is disposed on the first dielectric layer to cover the first circuit layer, wherein a first portion of the second dielectric layer is disposed in the through hole of the first dielectric layer. The conductive via extends through the first portion of the second dielectric layer in the through hole of the first dielectric layer, and is electrically isolated from the first circuit layer.

20 Claims, 41 Drawing Sheets

WIRING STRUCTURE, ASSEMBLY STRUCTURE AND METHOD FOR MANUFACTURING THE SAME

BACKGROUND

1. Field of the Disclosure

The present disclosure relates to a wiring structure, an assembly structure and a manufacturing method, and to a wiring structure including at least one through conductive via, an assembly structure including the same, and a method for manufacturing the same.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a thickness and a warpage of a semiconductor substrate may correspondingly increase, and a yield of the semiconductor substrate may decrease.

SUMMARY

In some embodiments, a wiring structure includes a first dielectric layer, a first circuit layer, a second dielectric layer and a conductive via. The first dielectric layer defines at least one through hole. The first circuit layer is disposed on the first dielectric layer. The second dielectric layer is disposed on the first dielectric layer to cover the first circuit layer, wherein a first portion of the second dielectric layer is disposed in the through hole of the first dielectric layer. The conductive via extends through the first portion of the second dielectric layer in the through hole of the first dielectric layer, and is electrically isolated from the first circuit layer.

In some embodiments, an assembly structure includes an upper wiring structure, a lower wiring structure and a conductive via. The upper wiring structure includes a first dielectric layer, a first circuit layer and a second dielectric layer. The first dielectric layer defines at least one through hole. The first circuit layer is disposed on the first dielectric layer. The second dielectric layer is disposed on the first dielectric layer to cover the first circuit layer. A first portion of the second dielectric layer is disposed in the through hole of the first dielectric layer. The lower wiring structure includes at least one dielectric layer and at least one circuit layer in contact with the dielectric layer, and is attached to the upper wiring structure. The conductive via extends through the upper wiring structure, and is electrically connected to the circuit layer of the lower wiring structure.

In some embodiments, a method for manufacturing an assembly structure includes: (a) providing an upper wiring structure including a first dielectric layer, a first circuit layer and a second dielectric layer, wherein the first dielectric layer defines at least one through hole, the first circuit layer is disposed on the first dielectric layer, the second dielectric layer is disposed on the first dielectric layer to cover the first circuit layer and in the through hole of the first dielectric layer; (b) providing a lower wiring structure including at least one dielectric layer and at least one circuit layer in contact with the dielectric layer; (c) bonding the upper wiring structure and the lower wiring structure together; and (d) forming a conductive via to extend through the upper wiring structure and electrically connect the circuit layer of the lower wiring structure, wherein the conductive via extends through a portion of the second dielectric layer in the through hole of the first dielectric layer, and electrically isolated from the first circuit layer.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
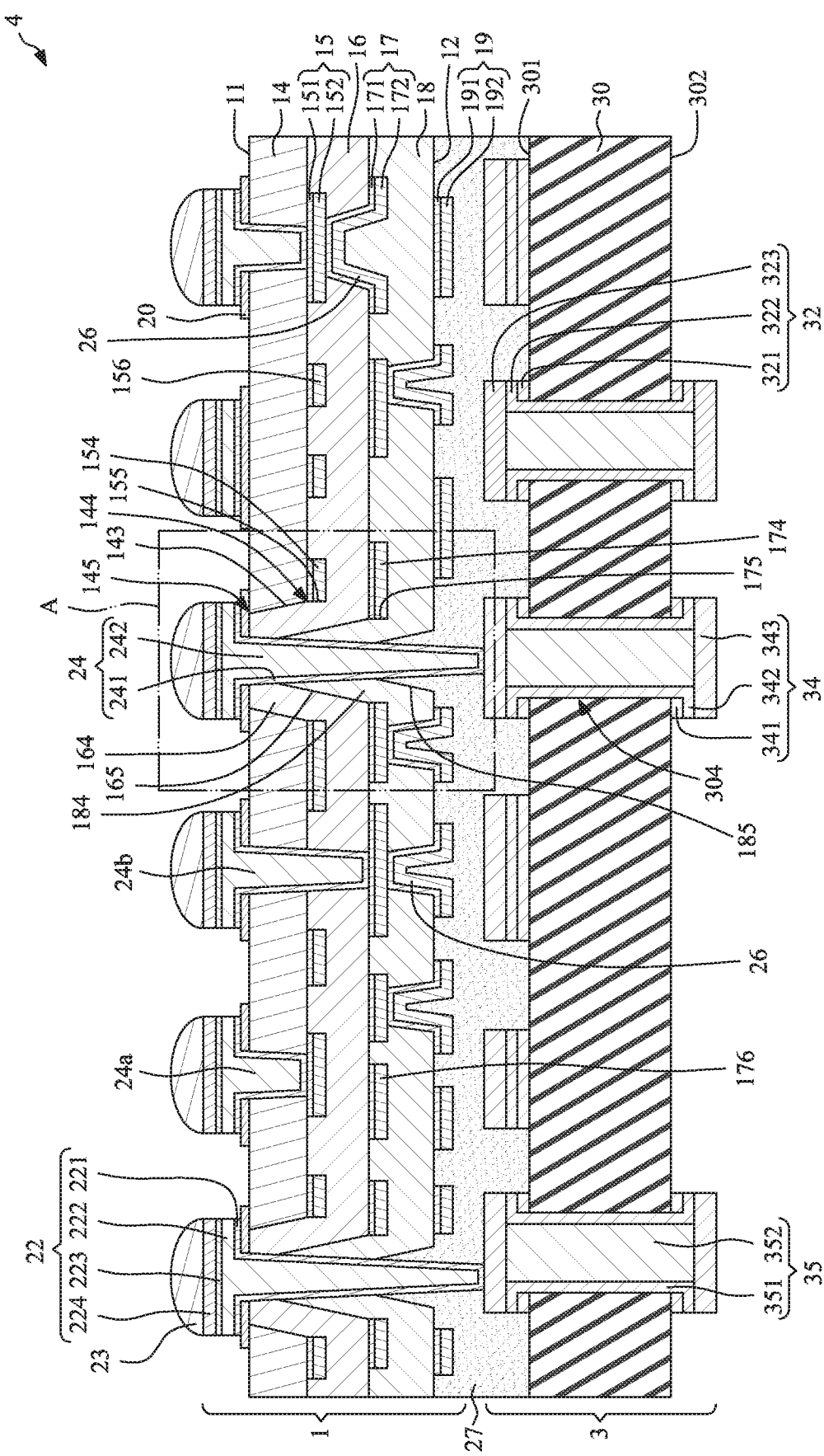
FIG. 1 illustrates a cross-sectional view of an assembly structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To meet the criteria of electrical connection, at least one conductive via may be formed in the semiconductor substrate. In some comparative embodiments, a manufacturing process of the conductive via may include the following stages. Firstly, the semiconductor substrate with a plurality of dielectric layers and a plurality of circuit layers is provided. Then, at least one hole may be formed in the dielectric layers by mechanical drilling or laser drilling (e.g., exposure and development). That is, the dielectric layers are irradiated by a laser beam through at least one opening of a photomask structure. Further, after the photomask structure is removed, portions of the dielectric layers are removed by a developing solvent to form the hole. Then, a metal material is formed or disposed in the hole to form the conductive via. During the formation of the hole, since the boundary between two stacked dielectric layers is a substantially flat plane, the two stacked dielectric layers will delaminate from each other readily. Thus, the yield of the conductive via is reduced. In addition, a width of the conductive via is relatively large, thus, a short circuit may readily occur when the conductive via is disposed in a high-density circuit region of the circuit layers. Usually, the conductive via may be disposed on a periphery of the semiconductor substrate, which will increase the size of the semiconductor substrate.

At least some embodiments of the present disclosure provide for a wiring structure and an assembly structure which has an improved yield. In some embodiments, a boundary between two stacked dielectric layers of a wiring structure is not a substantially flat plane so as to reduce a risk of delamination. At least some embodiments of the present disclosure further provide for techniques for manufacturing the wiring structure and the assembly structure.

Figure 2:
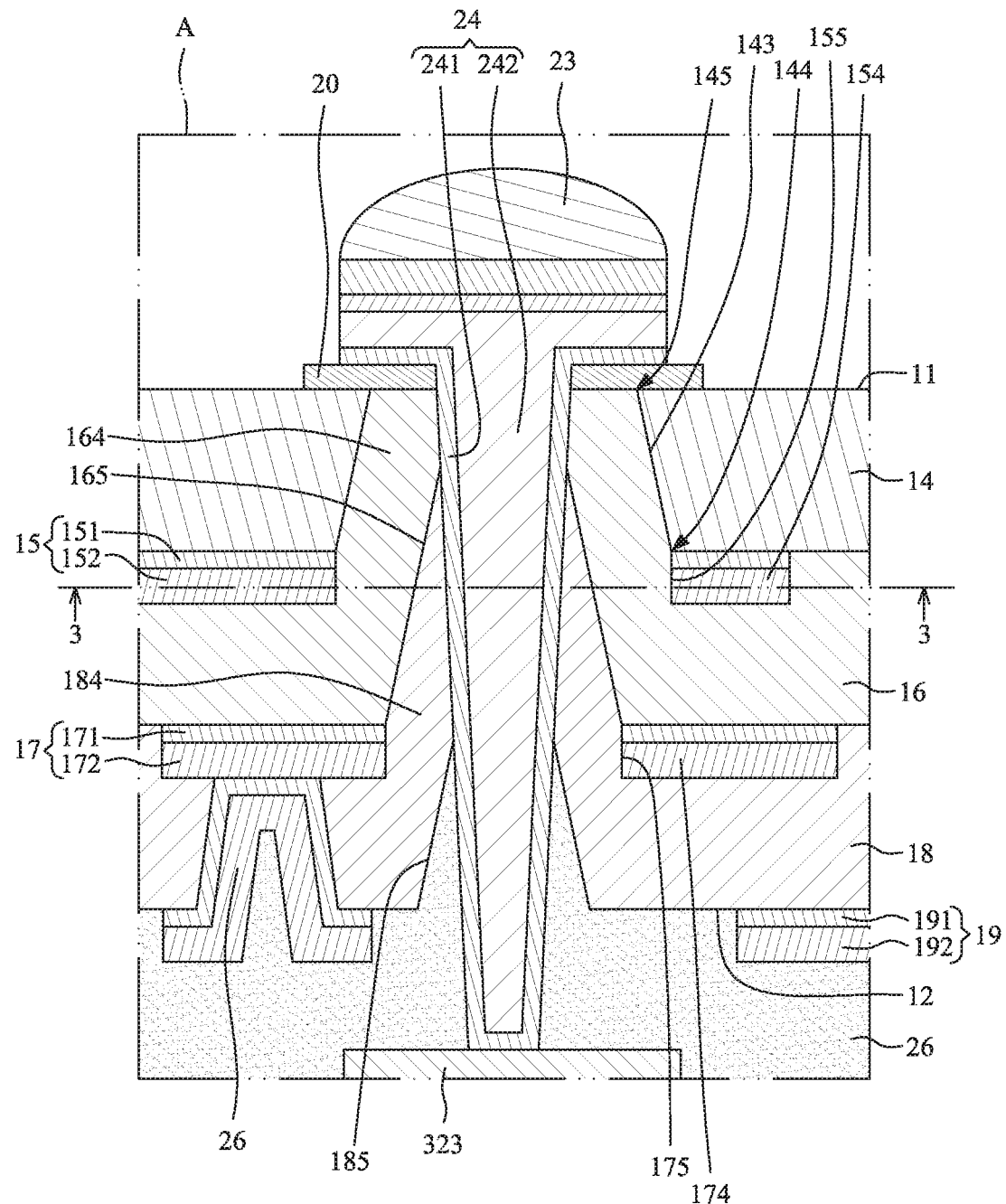
FIG. 2 illustrates an enlarged view of a region "A" in FIG. 1.
Figure 3:
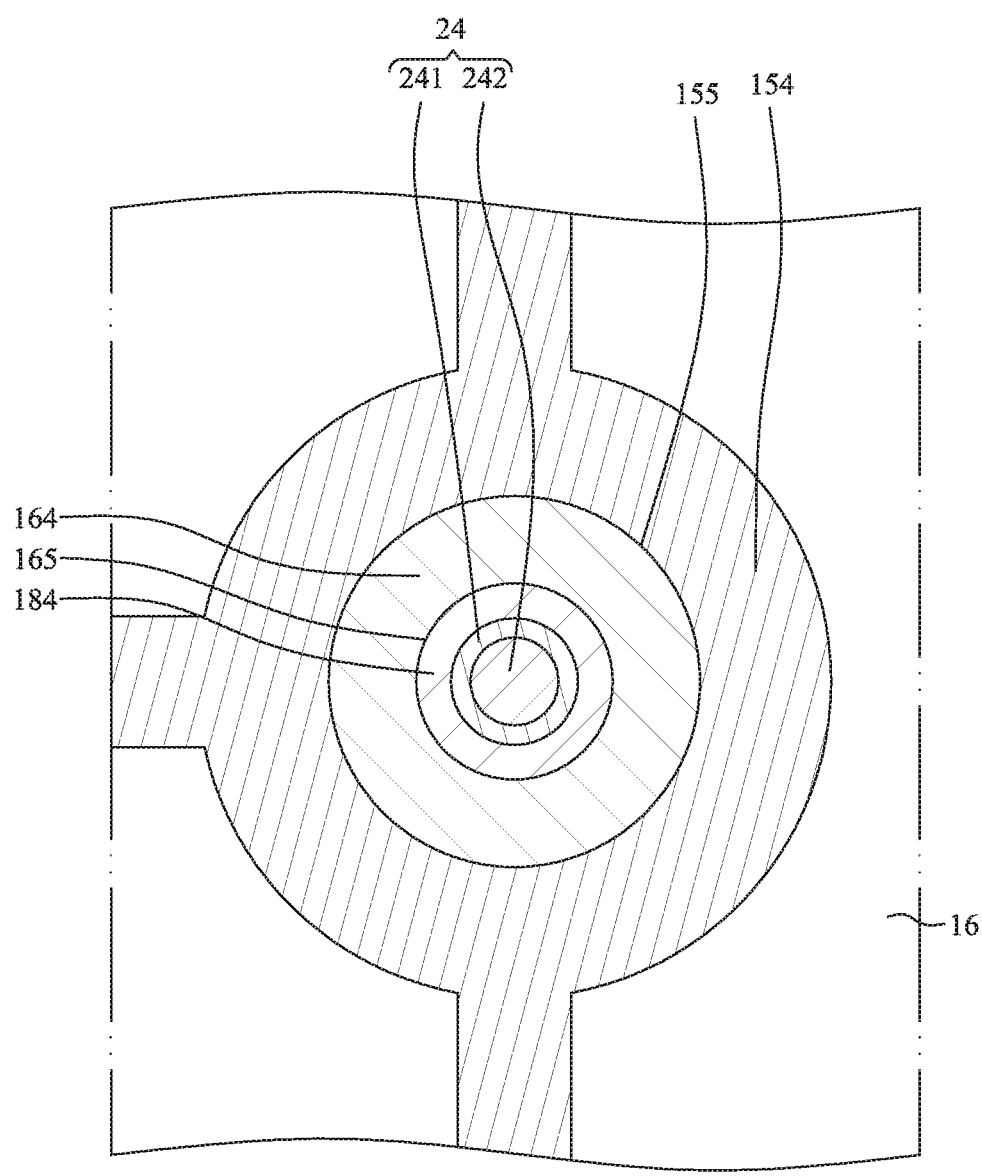
FIG. 3 illustrates a cross-sectional view taken along line 3-3 of FIG. 2.

FIG. 1 illustrates a cross-sectional view of an assembly structure 4 according to some embodiments of the present disclosure. FIG. 2 illustrates an enlarged view of a region "A" in FIG. 1. FIG. 3 illustrates a cross-sectional view taken along line 3-3 of FIG. 2. The assembly structure 4 includes an upper wiring structure 1, a lower wiring structure 3, an intermediate layer 27, at least one conductive via 24 and at least one external connector 23.

The upper wiring structure 1 has a top surface 11 and a bottom surface 12 opposite to the top surface 11. The upper wiring structure 1 includes at least one dielectric layer (including, for example, a first dielectric layer 14, a second dielectric layer 16 and a third dielectric layer 18), at least one circuit layer (including, for example, a first circuit layer 15, a second circuit layer 17 and a third circuit layer 19 formed of a metal, a metal alloy, or other conductive material) in contact with the dielectric layer (e.g., the first dielectric layer 14, the second dielectric layer 16 and the third dielectric layer 18), at least one inner via 26, an outer circuit layer 22 and a mask layer 20. In some embodiments, the upper wiring structure 1 may be similar to a coreless substrate, and may be in a wafer type, a panel type or a strip type. The upper wiring structure 1 may be also referred to as "a stacked structure" or "a high-density wiring structure" or "a high-density stacked structure".

The dielectric layers (e.g., the first dielectric layer 14, the second dielectric layer 16 and the third dielectric layer 18) are stacked on one another. For example, the first dielectric layer 14 is disposed on the second dielectric layer 16, and, thus, the first dielectric layer 14 may be the topmost dielectric layer. The second dielectric layer 16 is disposed on the third dielectric layer 18, and, thus, the third dielectric layer 18 may be the bottommost dielectric layer. In some embodiments, the dielectric layers (e.g., the first dielectric layer 14, the second dielectric layer 16 and the third dielectric layer 18) may be made of a cured photoimageable dielectric (PID) material such as epoxy or polyimide (PI) including photoinitiators.

The circuit layer (including, for example, the first circuit layer 15, the second circuit layer 17 and the third circuit layer 19) of the upper wiring structure 1 may be also referred to as "a high-density circuit layer". In some embodiments, a density of a circuit line (including, for example, a trace or a pad) of the high-density circuit layer is greater than a density of a circuit line of a low-density circuit layer. That is, the count of the circuit line (including, for example, a trace or a pad) in a unit area of the high-density circuit layer is greater than the count of the circuit line in an equal unit area of the low-density circuit layer, such as about 1.2 times or greater, about 1.5 times or greater, or about 2 times or greater. Alternatively, or in combination, a line width/line space (L/S) of the high-density circuit layer is less than a L/S of the low-density circuit layer, such as about 90% or less, about 50% or less, or about 20% or less.

The circuit layers (including, for example, the first circuit layer 15, the second circuit layer 17 and the third circuit layer 19) may be fan-out circuit layers or redistribution layers (RDLs). The first circuit layer 15 is disposed on the first dielectric layer 14 and embedded in the second dielectric layer 16, and an L/S of the first circuit layer 15 may be less than or equal to about 2 µm/about 2 µm, or less than or equal to about 1.8 µm/about 1.8 µm. The first circuit layer 15 may include a seed layer 151 and a conductive metallic material 152 disposed on the seed layer 151. Further, the second circuit layer 17 is disposed on the second dielectric layer 16 and embedded in the third dielectric layer 18, and an L/S of the second circuit layer 17 may be less than or equal to about 10 µm/about 10 µm, or less than or equal to about 5 µm/about 5 µm. The second circuit layer 17 may include a seed layer 171 and a conductive metallic material 172 disposed on the seed layer 171. In addition, the third circuit layer 19 is disposed on the third dielectric layer 18 and protrudes from the third dielectric layer 18, and an L/S of the third circuit layer 18 may be less than or equal to about 15 µm/about 15 µm, or less than or equal to about 10 µm/about 10 µm. The third circuit layer 19 may include a seed layer 191 and a conductive metallic material 192 disposed on the seed layer 191. In some embodiments, the L/S of the second circuit layer 17 may be greater than or equal to the L/S of the first circuit layer 15, and the L/S of the third circuit layer 19 may be greater than or equal to the L/S of the second circuit layer 17.

The upper wiring structure 1 includes a plurality of inner vias 26. Some of the inner vias 26 are disposed between the first circuit layer 15 and the second circuit layer 17 for electrically connecting the first circuit layer 15 and the second circuit layer 17. Some of the inner vias 26 are disposed between the second circuit layer 17 and the third circuit layer 19 for electrically connecting the second circuit layer 17 and the third circuit layer 19. In some embodiments, some of the inner vias 26 and the second circuit layer 17 may be formed integrally as a monolithic or one-piece structure, and some of the inner vias 26 and the third circuit layer 19 may be formed integrally as a monolithic or one-piece structure. Each inner via 26 tapers upward along a direction from the bottom surface 12 towards the top surface 11 of the upper wiring structure 1.

As shown in FIG. 1 and FIG. 2, the first dielectric layer 14 defines at least one through hole 143 that extends through the first dielectric layer 14 and tapers upward. The through hole 143 includes a first portion 144 near the first circuit layer 15 and a second portion 145 away from the first circuit layer 15, and a width of the first portion 144 is greater than a width of the second portion 145. Further, the first circuit layer 15 includes a first portion 154 and a second portion 156. The first portion 154 of the first circuit layer 15 is disposed adjacent to the through hole 143 of the first dielectric layer 14 and electrically isolated from the conductive via 24, and the first portion 154 surrounds the conductive via 24. As shown in FIG. 3, the first portion 154 of the first circuit layer 15 may be in a ring shape. In addition, the second portion 156 of the first circuit layer 15 is far away from the through hole 143 of the first dielectric layer 14. The first portion 154 of the first circuit layer 15 may define a first hole 155 extending through the first circuit layer 15 and corresponding to the through hole 143 of the first dielectric layer 14. The first portion 144 of the through hole 143 of the first dielectric layer 14 is near the first portion 154 of the first circuit layer, and the second portion 145 of the through hole 143 of the first dielectric layer 14 is away from the first portion 154 of the first circuit layer 15. In some embodiments, a size of the first portion 144 of the through hole 143 of the first dielectric layer 14 is substantially equal to a size of the first hole 155 of the first portion 154 of the first circuit layer 15.

As shown in FIG. 1 and FIG. 2, the second dielectric layer 16 is disposed on the first dielectric layer 14 to cover the first circuit layer 15, and includes a first portion 164 (or a protruded portion) disposed in the through hole 143 of the first dielectric layer 14. The first portion 164 of the second dielectric layer 16 in the through hole 143 of the first dielectric layer 14 tapers upward and extends through the first dielectric layer 14. Further, the first portion 164 of the second dielectric layer 16 is disposed between the conductive via 24 and a sidewall of the first hole 155 of the first portion 154 of the first circuit layer 15. In addition, the first portion 164 of the second dielectric layer 16 in the through hole 143 of the first dielectric layer 14 defines a central hole 165. The central hole 165 tapers upward.

The second circuit layer 17 is disposed on the second dielectric layer 16 and covered by the third dielectric layer 18. The second circuit layer 17 includes a first portion 174 and a second portion 176. The first portion 174 of the second circuit layer 17 is disposed adjacent to the central hole 165 of the second dielectric layer 16 and electrically isolated from the conductive via 24, and the first portion 174 surrounds the conductive via 24. As shown in FIG. 3, the first portion 174 of the second circuit layer 17 may be in a ring shape or other shape. In addition, the second portion 176 of the second circuit layer 17 is far away from the central hole 165 of the second dielectric layer 16. The first portion 174 of the second circuit layer 17 may define a first hole 175 extending through the second circuit layer 17 and corresponding to the central hole 165 of the second dielectric layer 16. In some embodiments, a size of the first hole 175 of the first portion 174 of the second circuit layer 17 may be substantially equal to or greater than a size of the central hole 165 of the second dielectric layer 16. In some embodiments, a diameter (or a width) of the first hole 175 of the first portion 174 of the second circuit layer 17 may be less than or equal to a diameter (or a width) of the first hole 155 of the first portion 154 of the first circuit layer 15.

As shown in FIG. 1 and FIG. 2, the third dielectric layer 18 is disposed on the second dielectric layer 16 to cover the second circuit layer 17, and includes a first portion 184 (or a protruded portion) disposed in the central hole 165 of the second dielectric layer 16. The first portion 184 of the third dielectric layer 18 in the central hole 165 of the second dielectric layer 16 tapers upward. The first portion 184 of the third dielectric layer 18 is disposed between the conductive via 24 and a sidewall of the first hole 175 of the first portion 174 of the second circuit layer 17. Further, the first portion 184 of the third dielectric layer 18 may be also disposed between the conductive via 24 and a sidewall of the first hole 155 of the first portion 154 of the first circuit layer 15. In addition, the first portion 184 of the third dielectric layer 18 in the central hole 165 of the second dielectric layer 16 defines a central hole 185. The central hole 185 tapers upward.

The conductive via 24 extends through the upper wiring structure 1 and the intermediate layer 27, and is electrically connected to and contacts the circuit layer 32 of the lower wiring structure 3. In some embodiments, the conductive via 24 is a monolithic structure, and a peripheral surface of the conductive via 24 is a substantially continuous plane. The conductive via 24 may extend through the first portion 164 of the second dielectric layer 16 in the through hole 143 of the first dielectric layer 14, and extends through the first portion 184 of the third dielectric layer 18 in the central hole 165 of the second dielectric layer 16. The conductive via 24 is electrically isolated from the first circuit layer 15 and the second circuit layer 17. The conductive via 24 may include a seed layer 241 and a conductive metallic material 242 disposed on the seed layer 241. The conductive via 24 may taper downward. Thus, a tapering direction of the conductive via 24 may be different from a tapering direction of the first portion 164 of the second dielectric layer 16 in the through hole 143 of the first dielectric layer 14. In some embodiments, the conductive via 24 may be disposed in a high-density region of the upper wiring structure 1, and an L/S of a circuit layer in the high-density region may be less than or equal to 10 µm/10 µm, less than or equal to about 5 µm/about 5 µm, or less than or equal to about 2 µm/about 2 µm.

In some embodiments, the low-density conductive structure (e.g., the lower wiring structure 3) is electrically connected to the high-density conductive structure (e.g., the upper wiring structure 1) solely by the conductive via 24. A length (along a longitudinal axis) of the conductive via 24 is greater than a thickness of the high-density conductive structure (e.g., the upper wiring structure 1). In some embodiments, a maximum width of the conductive via 24 may be greater than bout 20 µm and less than about 200 µm.

In some embodiments, the upper wiring structure 1 further includes at least one first inner conductive via 24a and at least one second inner conductive via 24b. The structures and materials of the first inner conductive via 24a and the second inner conductive via 24b may be similar to the structure and material of the conductive via 24. The first inner conductive via 24a extends through the first dielectric layer 14, and is electrically connected to and contacts the first circuit layer 15. The second inner conductive via 24b extends through the first dielectric layer 14 and the second dielectric layer 16, and is electrically connected to and contacts the second circuit layer 17.

The outer circuit layer 22 is disposed on the top surface 11 of the upper wiring structure 1 and electrically connected to the conductive via 24. In some embodiments, the outer circuit layer 22 and the conductive via 24 are formed concurrently and integrally. In some embodiments, the outer circuit layer 22 may include a first metal layer 221, a second metal layer 222, a third metal layer 223 and a fourth metal layer 224. A material of the first metal layer 221 may be titanium layer, a material of the second metal layer 222 may be copper layer, a material of the third metal layer 223 may be titanium layer, and a material of the fourth metal layer 224 may be copper layer. The first metal layer 221 of the outer circuit layer 22 and the seed layer 241 of the conductive via 24 may be the same layer. The second metal layer 222 of the outer circuit layer 22 and conductive metallic material 242 of the conductive via 24 may be the same layer. In addition, the mask layer 20 is interposed between the outer circuit layer 22 and the top surface 11 of the upper wiring structure 1. The conductive via 24 extends through the mask layer 20. A material of the mask layer 20 may be titanium or an alloy of copper and titanium. In addition, the external connector 23 (e.g., solder ball) may be disposed on the outer circuit layer 22 for external connection.

The lower wiring structure 3 includes at least one dielectric layer 30 and at least one circuit layer (including, for example, an upper circuit layer 32 and a lower circuit layer 34 formed of a metal, a metal alloy, or other conductive material) in contact with the dielectric layer 30. In some embodiments, the lower wiring structure 3 may be similar to a core substrate that includes a core portion (e.g., the dielectric layer 30), and may be in a wafer type, a panel type or a strip type. The lower wiring structure 3 may be also referred to as "a stacked structure" or "a low-density conductive structure" or "a low-density stacked structure". The circuit layer (including, for example, the upper circuit layer 32 and the lower circuit layer 34) of the lower wiring structure 3 may be also referred to as "a low-density circuit layer". The lower wiring structure 3 is attached to the upper wiring structure 1 through, for example, the intermediate layer 27.

In some embodiments, a material of the core portion (e.g., the dielectric layer 30) may include an insulating film, such as Ajinomoto build-up film (ABF). The core portion (e.g., the dielectric layer 30) has a top surface 301 and a bottom surface 302 opposite to the top surface 301, and defines a plurality of through holes 304 extending through the core portion (e.g., the dielectric layer 30). An interconnection via 35 is disposed or formed in each through hole 304 for vertical connection. In some embodiments, each interconnection via 35 includes a base metallic layer 351 and an insulation material 352. The base metallic layer 351 is disposed or formed on a side wall of the through hole 304, and defines a central through hole. The insulation material 352 fills the central through hole defined by the base metallic layer 351. In some embodiments, the interconnection via 35 may omit an insulation material, and may include a bulk metallic material that fills the through hole 304.

The upper circuit layer 32 is formed or disposed on and protrudes from the top surface 301 of the dielectric layer 30. An L/S of the upper circuit layer 32 may be greater than or equal to about 20 μm/about 20 μm. Thus, the L/S of the upper circuit layer 32 may be greater than or equal to about five times the L/S of the first circuit layer 15 of the upper wiring structure 1. In some embodiments, the upper circuit layer 32 may include a first metallic layer 321, a second metallic layer 322 and a third metallic layer 323. The first metallic layer 321 is disposed on the top surface 301 of the dielectric layer 30, and may be formed from a copper foil (e.g., may constitute a portion of the copper foil). The second metallic layer 322 is disposed on the first metallic layer 321, and may be a plated copper layer. The third metallic layer 323 is disposed on the second metallic layer 322, and may be another plated copper layer. In some embodiments, the third metallic layer 323 may be omitted.

The lower circuit layer 34 is formed or disposed on and protrudes from the bottom surface 302 of the dielectric layer 30. An L/S of the lower circuit layer 34 may be greater than or equal to about 20 μm/about 20 μm. Thus, the L/S of the lower circuit layer 34 may be greater than or equal to about five times the L/S of the first circuit layers 15 of the upper wiring structure 1. In some embodiments, the lower circuit layer 34 may include a first metallic layer 341, a second metallic layer 342 and a third metallic layer 343. The first metallic layer 341 is disposed on the bottom surface 302 of the dielectric layer 30, and may be formed from a copper foil. The second metallic layer 342 is disposed on the first metallic layer 341, and may be a plated copper layer. The third metallic layer 343 is disposed on the second metallic layer 342, and may be another plated copper layer. In some embodiments, the third metallic layer 343 may be omitted.

In some embodiments, each interconnection via 35 electrically connects the upper circuit layer 32 and the lower circuit layer 34. The base metallic layer 351 of the interconnection via 35, the second metallic layer 322 of the upper circuit layer 32 and the second metallic layer 342 the lower circuit layer 34 may be formed integrally and concurrently as a monolithic or one-piece structure.

The intermediate layer 27 is interposed or disposed between the upper wiring structure 1 and the lower wiring structure 3 to bond the upper wiring structure 1 and the lower wiring structure 3 together. That is, the intermediate layer 27 adheres to the bottom surface 12 of the upper wiring structure 1 and the top surface 301 of the dielectric layer 30 of the lower wiring structure 3. In some embodiments, the intermediate layer 27 may be an adhesion layer that is cured from an adhesive material (e.g., includes a cured adhesive material such as an adhesive polymeric material). Thus, the third circuit layer 19 of the upper wiring structure 1 and the upper circuit layer 32 of the lower wiring structure 3 are embedded in the intermediate layer 27. In some embodiments, a portion of the intermediate layer 27 may extend into the central hole 185 of the first portion 184 of the third dielectric layer 18. In some embodiments, the intermediate layer 27 may include an insulating film material, such as ABF type material.

As shown in the embodiment illustrated in FIG. 1 to FIG. 3, the assembly structure 4 is a combination of the upper wiring structure 1 and the lower wiring structure 3, in which the circuit layers 15, 17, 19 of the upper wiring structure 1 has fine pitch and low thickness; and the circuit layers 32, 34 of the lower wiring structure 3 have low manufacturing cost. Thus, the assembly structure 4 has an advantageous compromise of yield and manufacturing cost, and the assembly structure 4 has a relatively low thickness. In addition, the warpage of the upper wiring structure 1 and the warpage of the lower wiring structure 3 are separated and will not influence each other. That is, the warpage of the lower wiring structure 3 will not be accumulated onto the warpage of the upper wiring structure 1. Thus, the yield of the assembly structure 4 may be further improved.

Further, during a manufacturing process, the lower wiring structure 3 and the upper wiring structure 1 may be tested individually before being bonded together. Therefore, known good lower wiring structure 3 and known good upper wiring structure 1 may be selectively bonded together. Bad (or unqualified) lower wiring structure 3 and bad (or unqualified) upper wiring structure 1 may be discarded. As a result, the yield of the assembly structure 4 may be further improved.

As shown in FIG. 1, the first portion 164 of the second dielectric layer 16 is disposed in the through hole 143 of the first dielectric layer 14 to form a truncated cone. Thus, the boundary between the second dielectric layer 16 and the first dielectric layer 14 is not a substantially flat plane. For example, there is an inclination angle between a portion of the boundary (e.g., the bottom surface of the first dielectric layer 14) between the second dielectric layer 16 and the first dielectric layer 14 and another portion of the boundary (e.g., the sidewall surface of the through hole 143 of the first dielectric layer 14) between the second dielectric layer 16 and the first dielectric layer 14. Thus, during a formation process of a though hole for accommodating the conductive via 24, the two stacked dielectric layers (the second dielectric layer 16 and the first dielectric layer 14) will not delaminate from each other readily. Similarly, the first portion 184 of the third dielectric layer 18 is disposed in the central hole 165 of the second dielectric layer 16 to form a truncated cone. Thus, the boundary between the third dielectric layer 18 and the second dielectric layer 16 is not a substantially flat plane. Thus, during a formation process of a though hole for accommodating the conductive via 24, the two stacked dielectric layers (the second dielectric layer 16 and the third dielectric layer 18) will not delaminate from each other readily. Thus, the yield of the conductive via 24 is improved. In addition, the conductive via 24 may extend through the first hole 155 of the first portion 154 of the first circuit layer 15 without contacting the first portion 154 of the first circuit layer 15, thus, a short circuit may not readily occur when the conductive via 24 is disposed in a high-density circuit region of the first circuit layer 15. As a result, the size of the assembly structure 4 may not increase.

Figure 4:
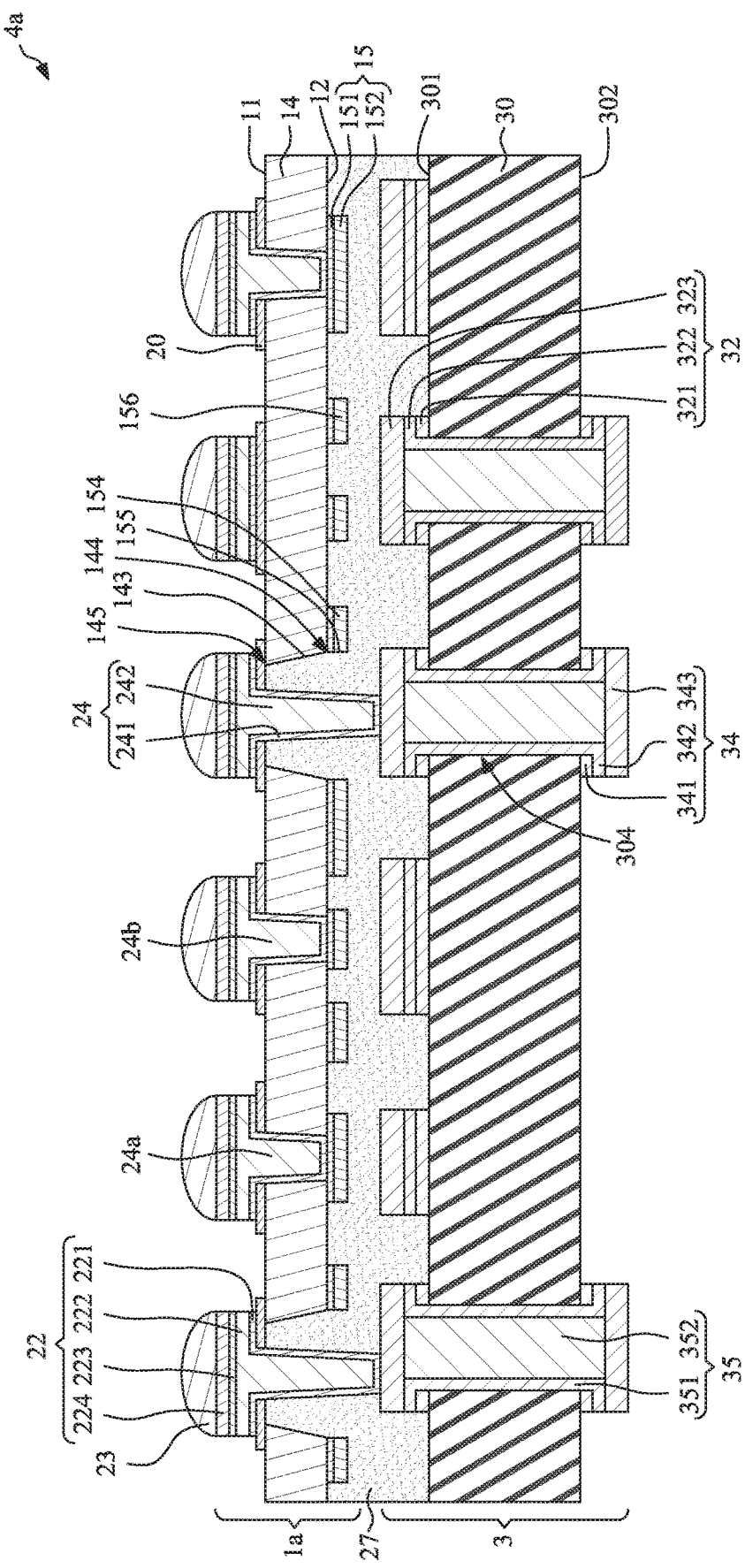
FIG. 4 illustrates a cross-sectional view of an assembly structure according to some embodiments of the present disclosure.

FIG. 4 illustrates a cross-sectional view of an assembly structure 4a according to some embodiments of the present disclosure. The assembly structure 4a is similar to the assembly structure 4 shown in FIG. 1 to FIG. 3, except for a structure of an upper wiring structure 1a. As shown in FIG. 4, the upper wiring structure 1a only includes one dielectric layer (e.g., the first dielectric layer 14) and one circuit layer (e.g., the first circuit layer 15). That is, the second dielectric layer 16, the third dielectric layer 18, the second circuit layer 17 and the third circuit layer 19 are omitted. As shown in FIG. 4, the intermediate layer 27 may extend into the through hole 143 of the first dielectric layer 14.

Figure 5:
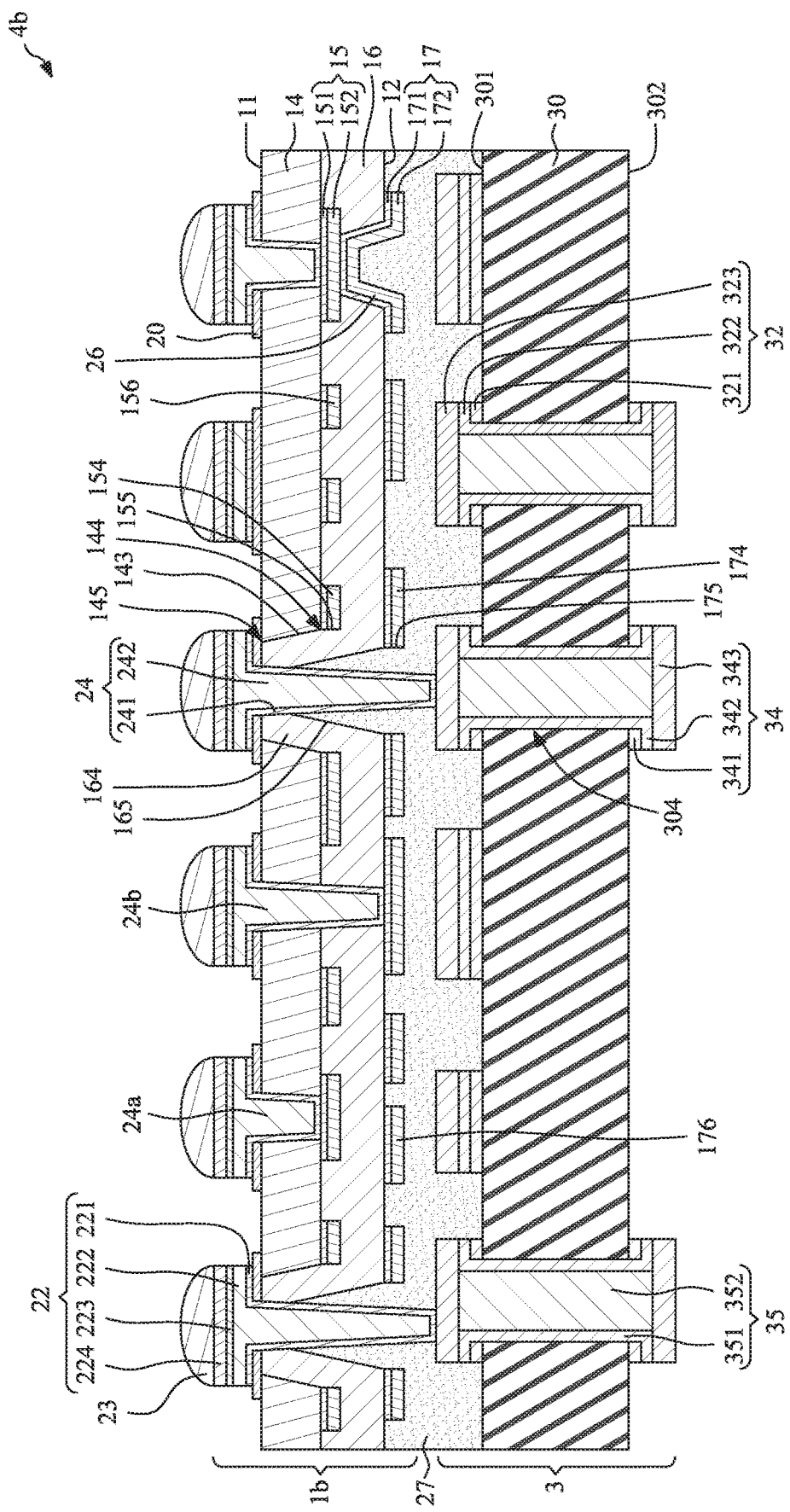
FIG. 5 illustrates a cross-sectional view of an assembly structure according to some embodiments of the present disclosure.

FIG. 5 illustrates a cross-sectional view of an assembly structure 4b according to some embodiments of the present disclosure. The assembly structure 4b is similar to the assembly structure 4 shown in FIG. 1 to FIG. 3, except for a structure of an upper wiring structure 1b. As shown in FIG. 5, the upper wiring structure 1b only includes two dielectric layers (e.g., the first dielectric layer 14 and the second dielectric layer 16) and two circuit layers (e.g., the first circuit layer 15 and the second circuit layer 17). That is, the third dielectric layer 18 and the third circuit layer 19 are omitted. As shown in FIG. 5, the intermediate layer 27 may extend into the central hole 165 of the second dielectric layer 16.

Figure 6:
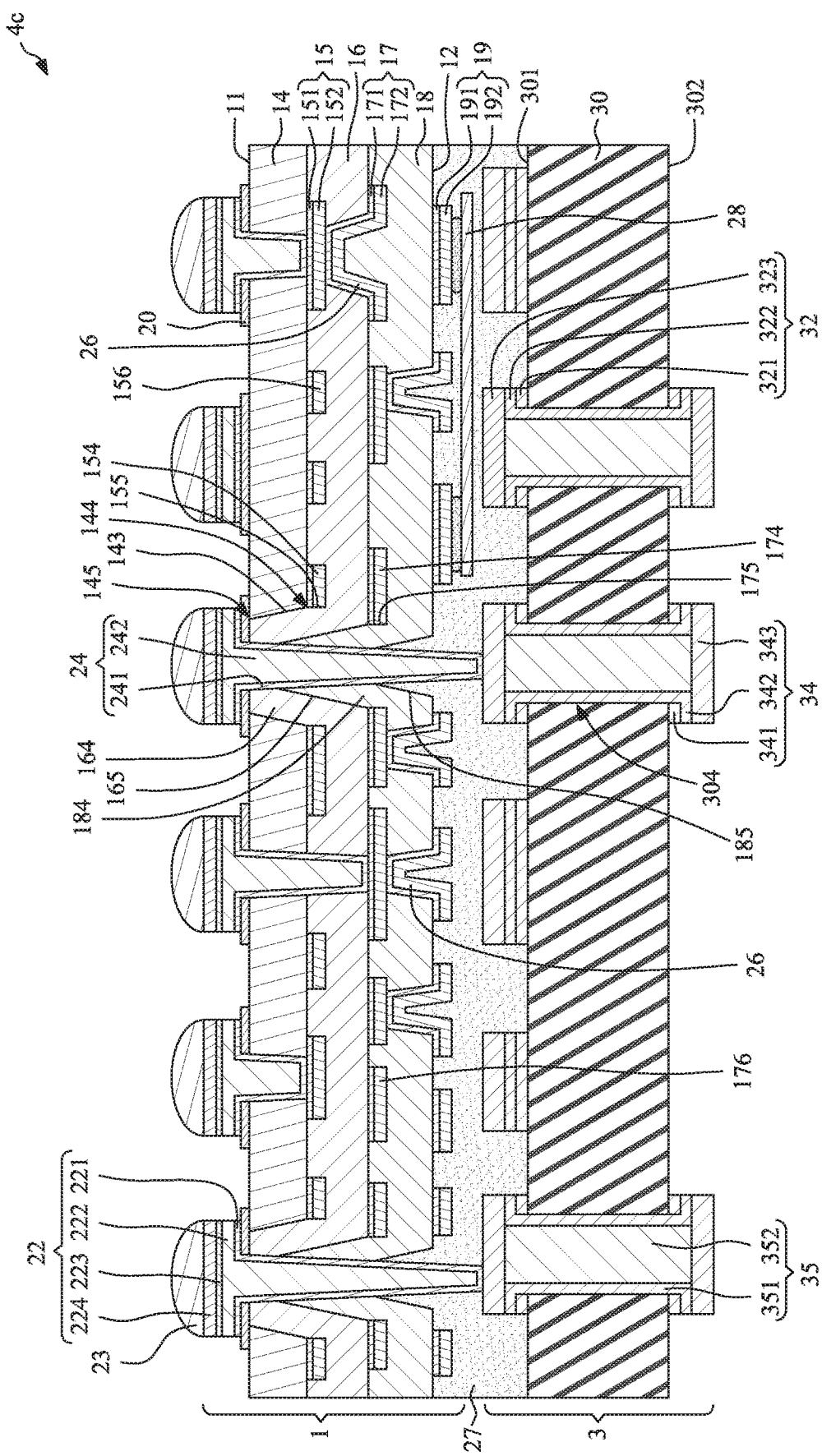
FIG. 6 illustrates a cross-sectional view of an assembly structure according to some embodiments of the present disclosure.

FIG. 6 illustrates a cross-sectional view of an assembly structure 4c according to some embodiments of the present disclosure. The assembly structure 4c is similar to the assembly structure 4 shown in FIG. 1 to FIG. 3, except that at least one semiconductor chip 28 is further included. In some embodiments, the semiconductor chip 28 may be disposed adjacent to the bottom surface 12 of the upper wiring structure 1, and may be disposed between the upper wiring structure 1 and the lower wiring structure 3. As shown in FIG. 6, the semiconductor chip 28 may be attached to or electrically connected to the third circuit layer 19 of the upper wiring structure 1.

Figure 7:
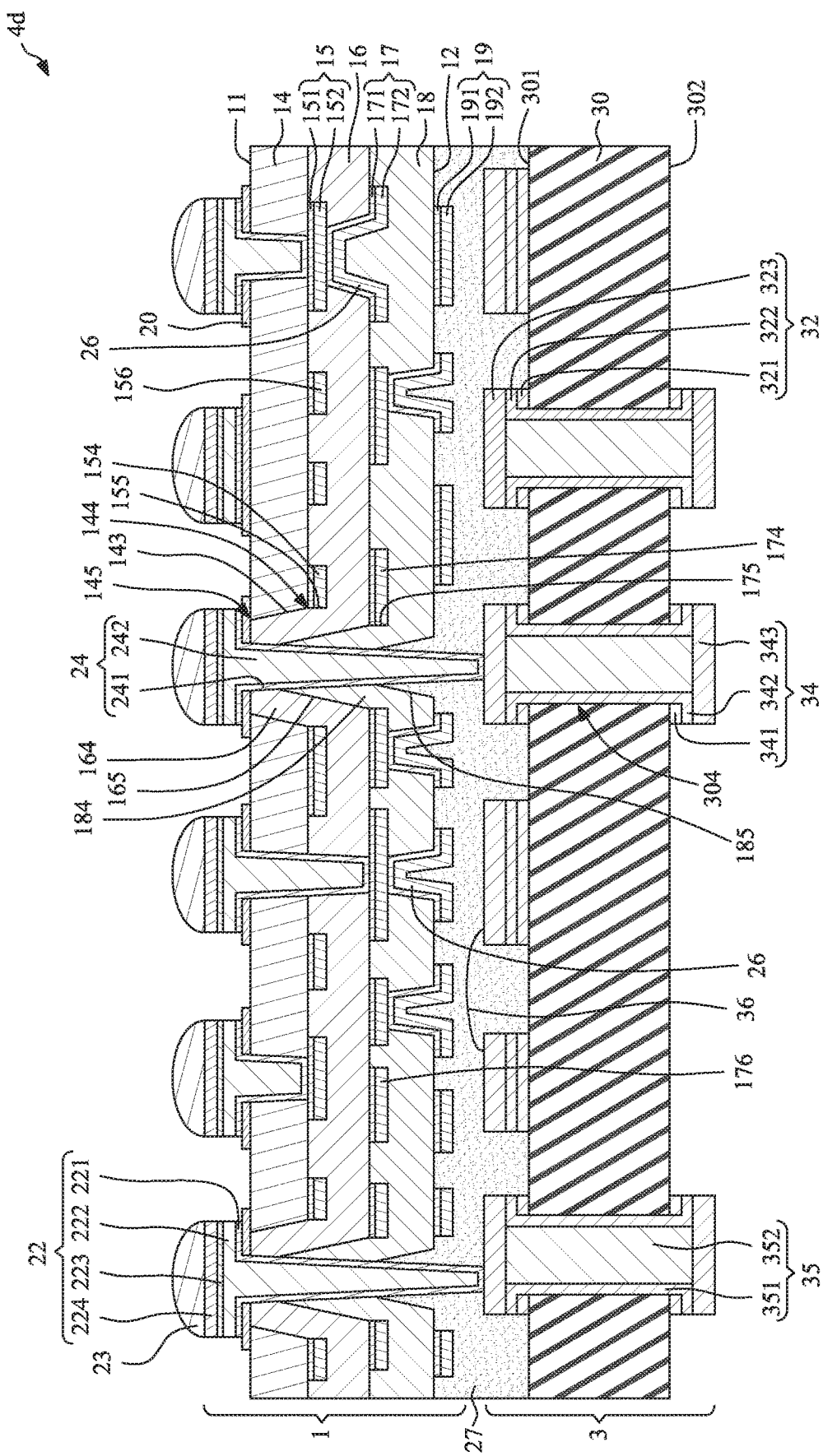
FIG. 7 illustrates a cross-sectional view of an assembly structure according to some embodiments of the present disclosure.

FIG. 7 illustrates a cross-sectional view of an assembly structure 4d according to some embodiments of the present disclosure. The assembly structure 4d is similar to the assembly structure 4 shown in FIG. 1 to FIG. 3, except that at least one bonding wire 36 is further included. In some embodiments, the bonding wire 36 may be used to connect two portions of the upper circuit layer 32 of the lower wiring structure 3.

Figure 8:
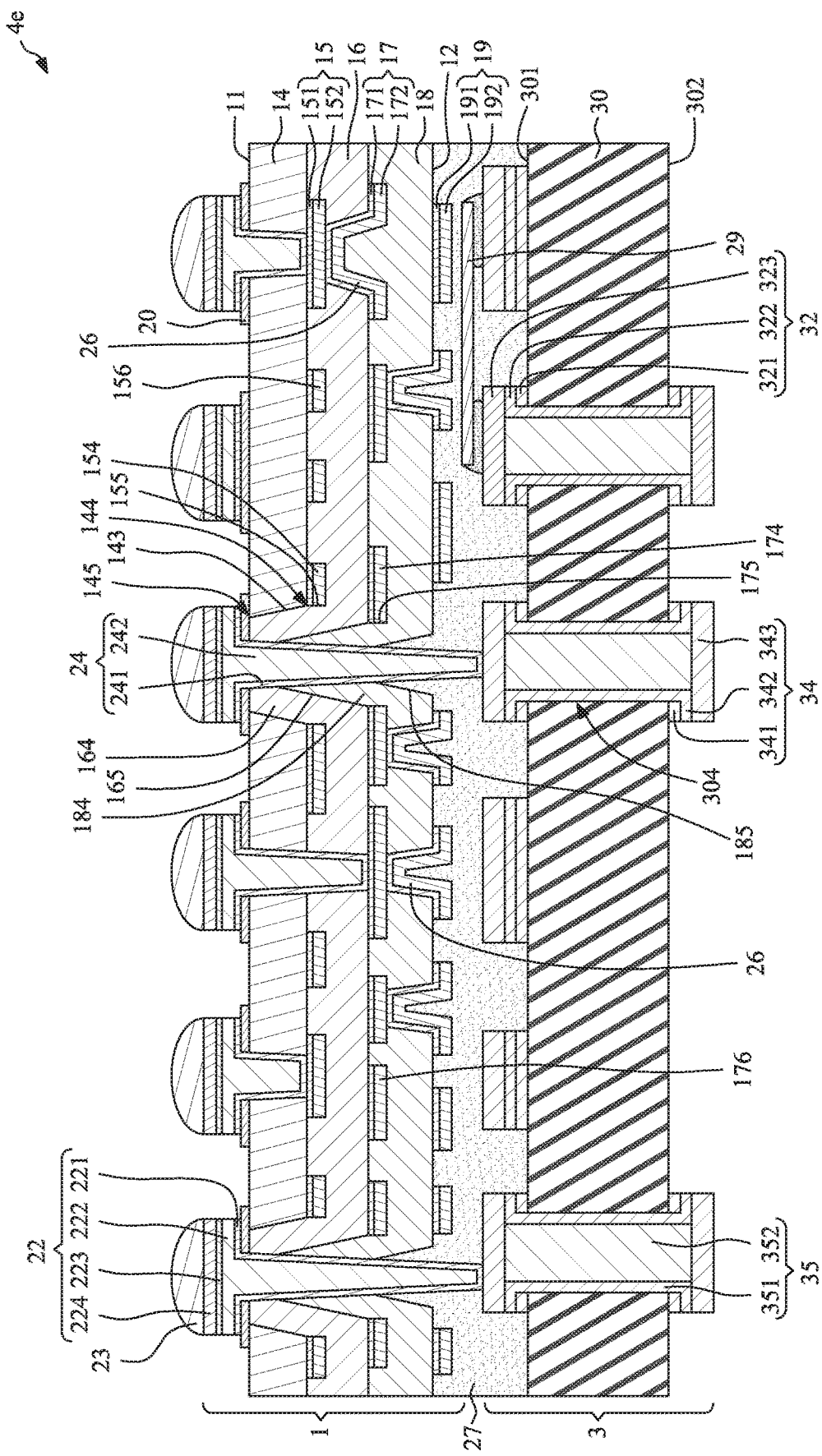
FIG. 8 illustrates a cross-sectional view of an assembly structure according to some embodiments of the present disclosure.

FIG. 8 illustrates a cross-sectional view of an assembly structure 4e according to some embodiments of the present disclosure. The assembly structure 4e is similar to the assembly structure 4 shown in FIG. 1 to FIG. 3, except that at least one passive component 29 is further included. In some embodiments, the passive component 29 may be disposed adjacent to the top surface 301 of the dielectric layer 30 of the lower wiring structure 3, and may be disposed between the upper wiring structure 1 and the lower wiring structure 3. As shown in FIG. 8, the passive component 29 may be attached to or electrically connected to the upper circuit layer 32 of the lower wiring structure 3.

Figure 9:
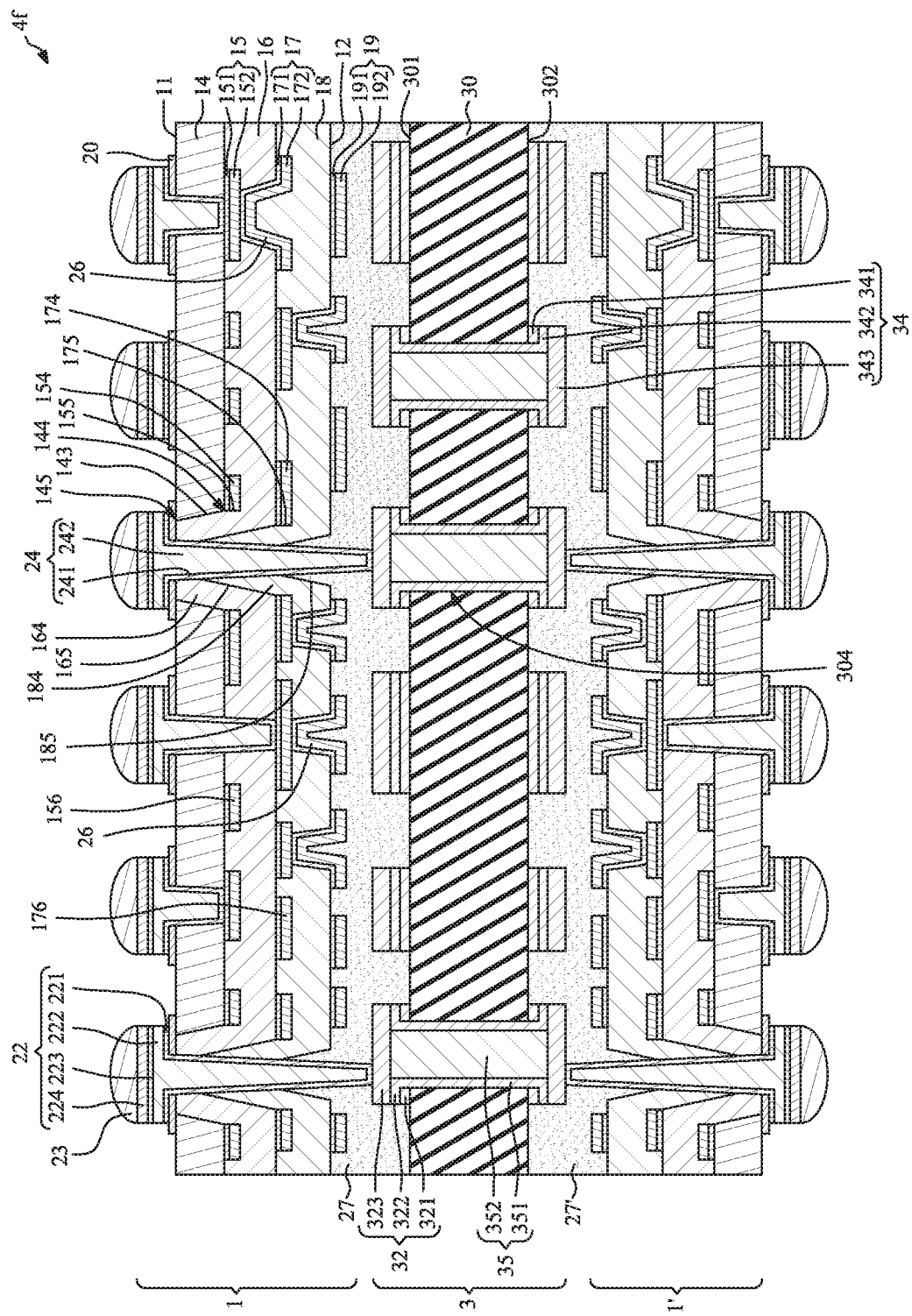
FIG. 9 illustrates a cross-sectional view of an assembly structure according to some embodiments of the present disclosure.

FIG. 9 illustrates a cross-sectional view of an assembly structure 4f according to some embodiments of the present disclosure. The assembly structure 4f is similar to the assembly structure 4 shown in FIG. 1 to FIG. 3, except that a bottom wiring structure 1' is further included. In some embodiments, the bottom wiring structure 1' attached to the bottom surface 302 of the dielectric layer 30 of the lower wiring structure 3. As shown in FIG. 9, the structure of the bottom wiring structure 1' is similar to the structure of the upper wiring structure 1. For example, the structure of the bottom wiring structure 1' and the structure of the upper wiring structure 1 are symmetrical. Thus, a warpage of the assembly structure 4f may be reduced.

FIG. 10 through FIG. 37 illustrate a method for manufacturing an assembly structure according to some embodiments of the present disclosure. In some embodiments, the method is for manufacturing the assembly structure 4 shown in FIG. 1 to FIG. 3.

Figure 10:
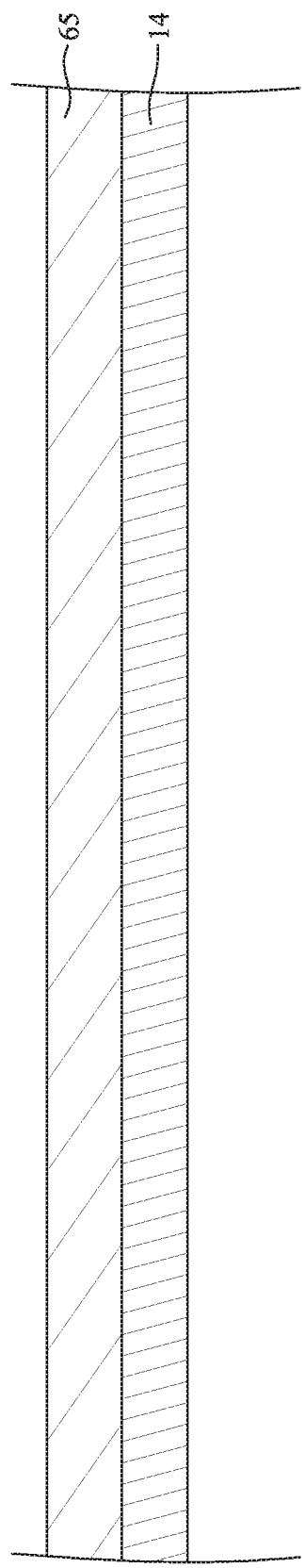
FIG. 10 illustrates one or more stages of an example of a method for manufacturing an assembly structure according to some embodiments of the present disclosure.

Referring to FIG. 10 through FIG. 29, an upper wiring structure 1 is provided. The upper wiring structure 1 is manufactured as follows. Referring to FIG. 10, a carrier 65 is provided. The carrier 65 may be a glass carrier, and may be in a wafer type, a panel type or a strip type.

Figure 11:
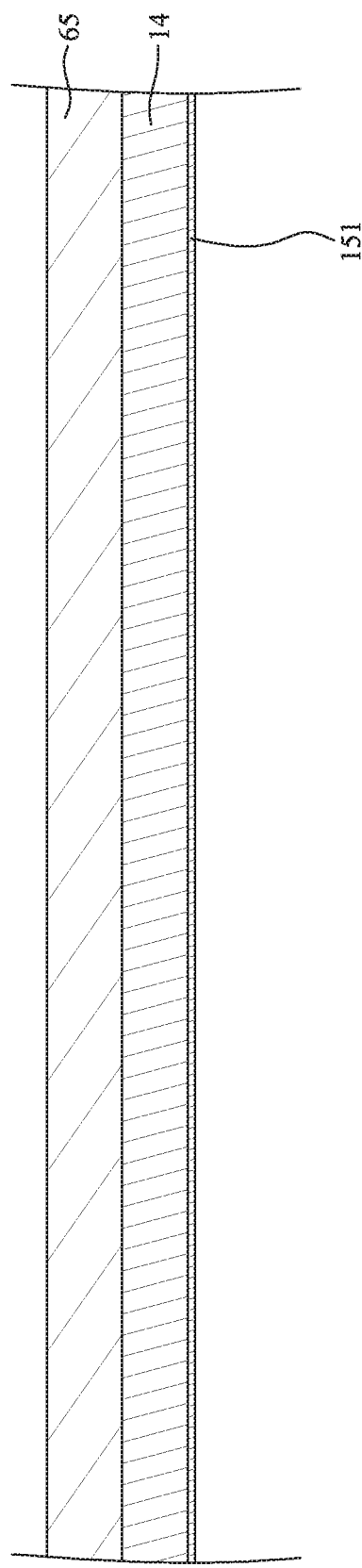
FIG. 11 illustrates one or more stages of an example of a method for manufacturing an assembly structure according to some embodiments of the present disclosure.

Referring to FIG. 11, a first dielectric layer 14 is formed or disposed on the carrier 65. Then, a seed layer 151 is formed or disposed on the first dielectric layer 14 by a physical vapor deposition (PVD) technique or other suitable techniques.

Figure 12:
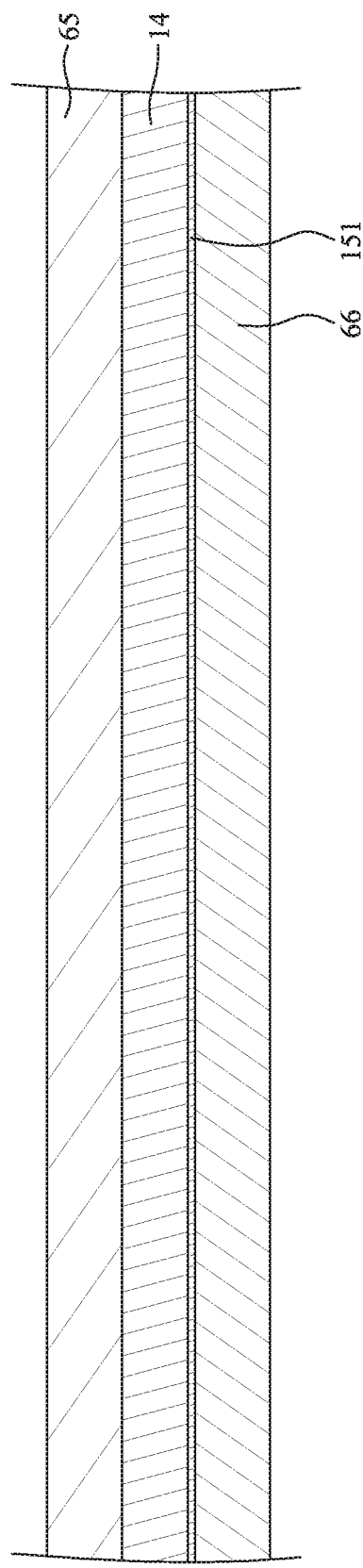
FIG. 12 illustrates one or more stages of an example of a method for manufacturing an assembly structure according to some embodiments of the present disclosure.

Referring to FIG. 12, a photoresist layer 66 is formed or disposed on the seed layer 151 by, for example, lamination.

Figure 13:
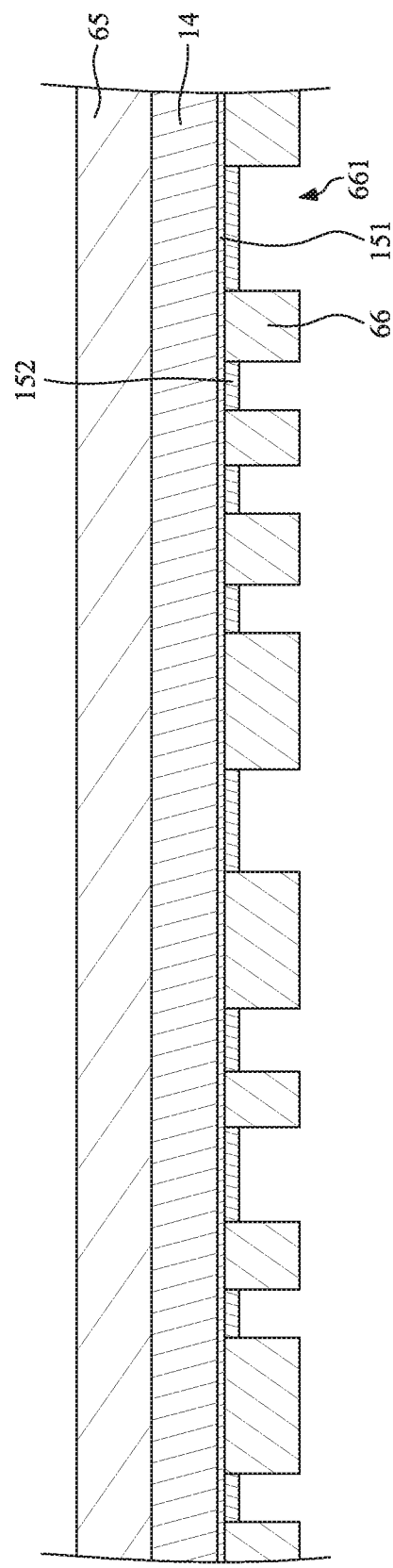
FIG. 13 illustrates one or more stages of an example of a method for manufacturing an assembly structure according to some embodiments of the present disclosure.

Referring to FIG. 13, a plurality of openings 661 are formed in the photoresist layer 66 by an exposure and development technique or other suitable techniques to expose portions of the seed layer 151. Then, a conductive metallic material 152 is formed on the exposed portions of the seed layer 151 in the openings 661 by a plating technique or other suitable techniques.

Figure 14:
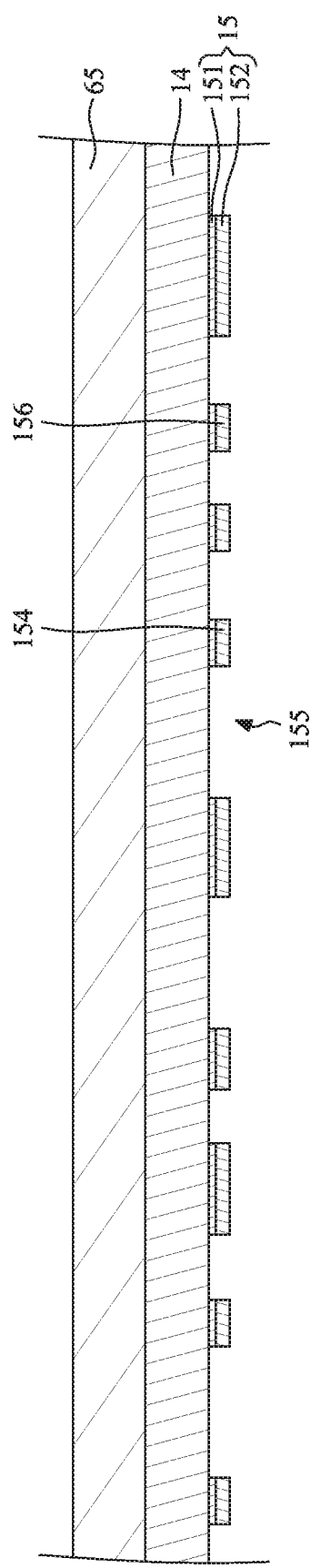
FIG. 14 illustrates one or more stages of an example of a method for manufacturing an assembly structure according to some embodiments of the present disclosure.
Figure 15:
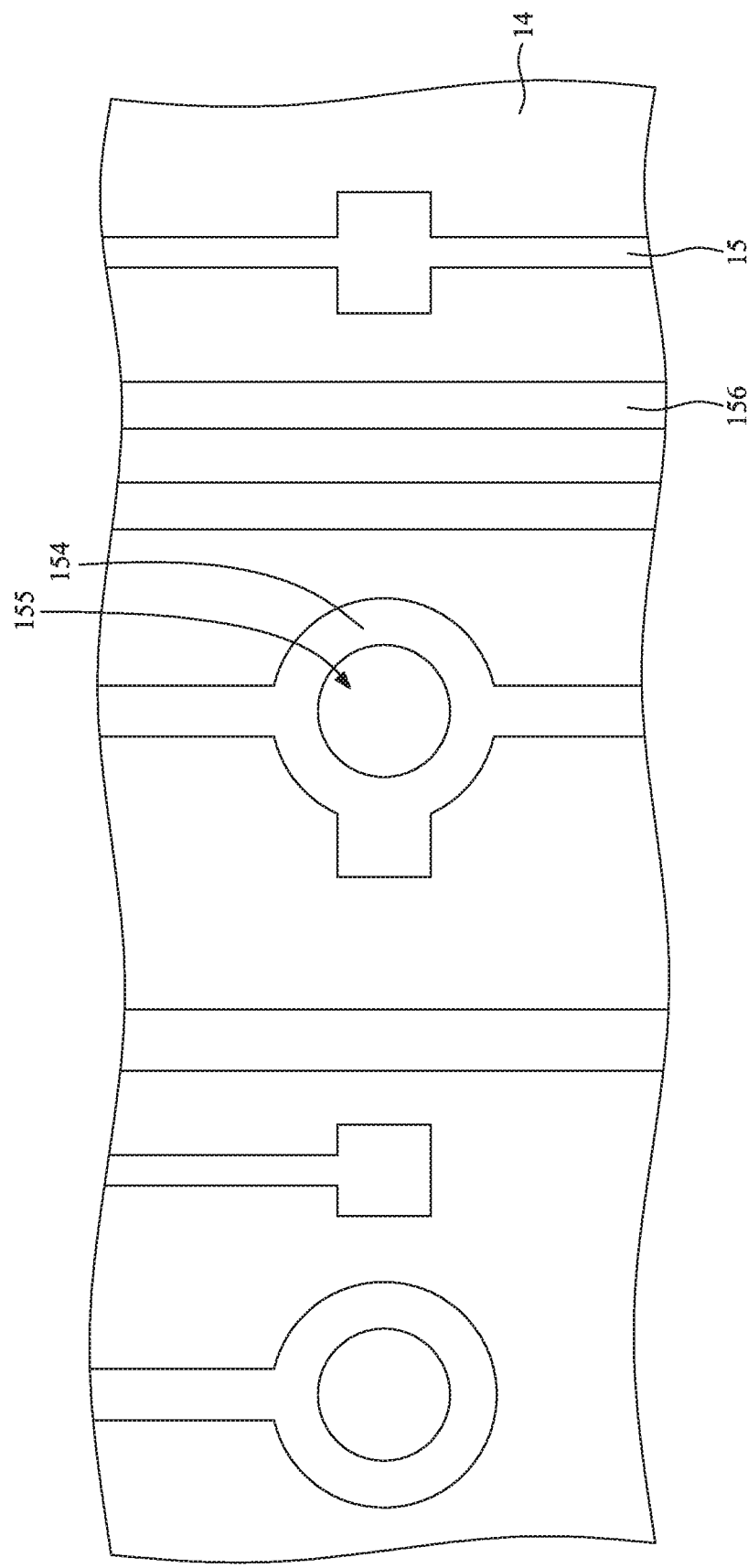
FIG. 15 illustrates one or more stages of an example of a method for manufacturing an assembly structure according to some embodiments of the present disclosure.

Referring to FIG. 14 and FIG. 15, wherein FIG. 15 illustrates a bottom view of FIG. 14, the photoresist layer 66 is removed by a stripping technique or other suitable techniques. Then, the portions of the seed layer 151 that are not covered by the conductive metallic material 152 are moved by an etching technique or other suitable techniques. Meanwhile, a first circuit layer 15 is formed. The first circuit layer 15 may be a fan-out circuit layer or an RDL, and an L/S of the first circuit layer 15 may be less than or equal to about 2 μm/about 2 μm, or less than or equal to about 1.8 μm/about 1.8 μm. The first circuit layer 15 is disposed on the bottom surface of the first dielectric layer 14. In some embodiments, the first circuit layer 15 may include a seed layer 151 and a conductive metallic material 152 disposed on the seed layer 151. In some embodiments, the first circuit layer 15 includes a first portion 154 and a second portion 156. As shown in FIG. 15, the first portion 154 of the first circuit layer 15 may be in a ring shape. The first portion 154 of the first circuit layer 15 may define a first hole 155 extending through the first circuit layer 15.

Figure 16:
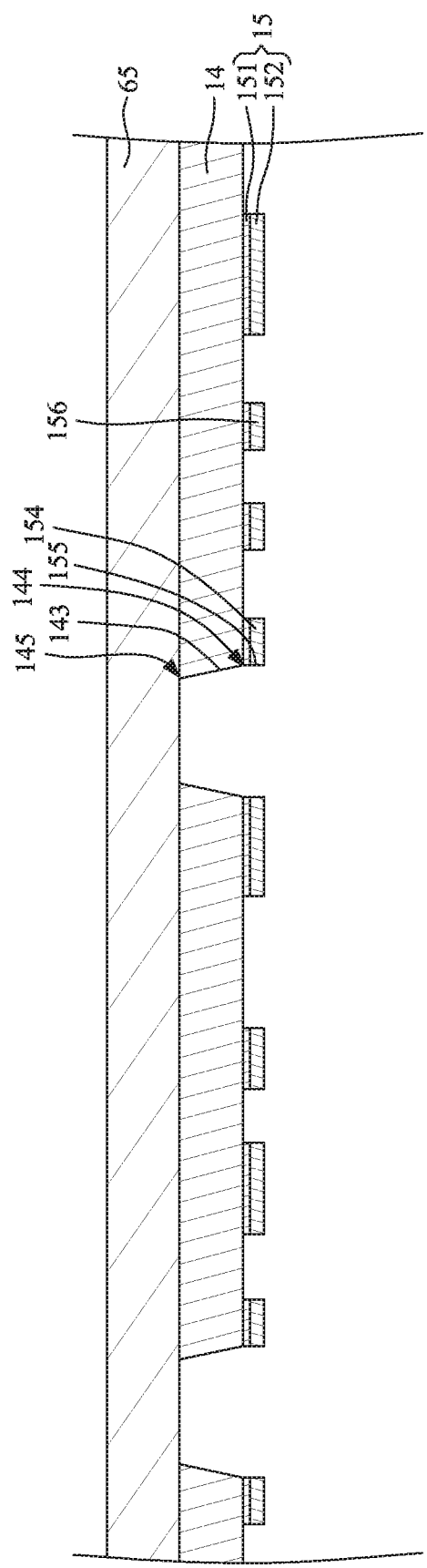
FIG. 16 illustrates one or more stages of an example of a method for manufacturing an assembly structure according to some embodiments of the present disclosure.

Referring to FIG. 16, at least one through hole 143 is formed to extend through the first dielectric layer 14 by using the first circuit layer 14 as a mask. As shown in FIG. 16, a portion of the first dielectric layer 14 corresponding to the first hole 155 of the first portion 154 of the first circuit layer 15 is removed by, for example, laser drilling or other suitable techniques. The through hole 143 tapers upward and includes a first portion 144 near the first portion 154 of the first circuit layer 15 and a second portion 145 away from the first portion 154 of the first circuit layer 15. A width of the first portion 144 is greater than a width of the second portion 145. In some embodiments, a size of the first portion 144 of the through hole 143 of the first dielectric layer 14 is substantially equal to a size of the first hole 155 of the first portion 154 of the first circuit layer 15. That is, the through hole 143 of the first dielectric layer 14 is determined by the first hole 155 of the first portion 154 of the first circuit layer 15.

Figure 17:
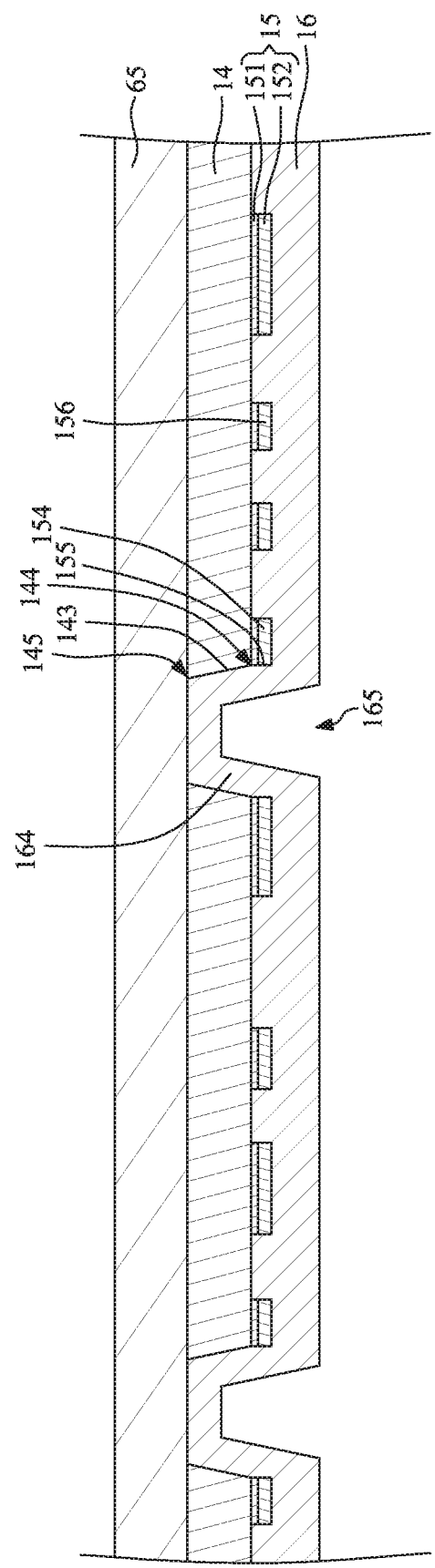
FIG. 17 illustrates one or more stages of an example of a method for manufacturing an assembly structure according to some embodiments of the present disclosure.
Figure 18:
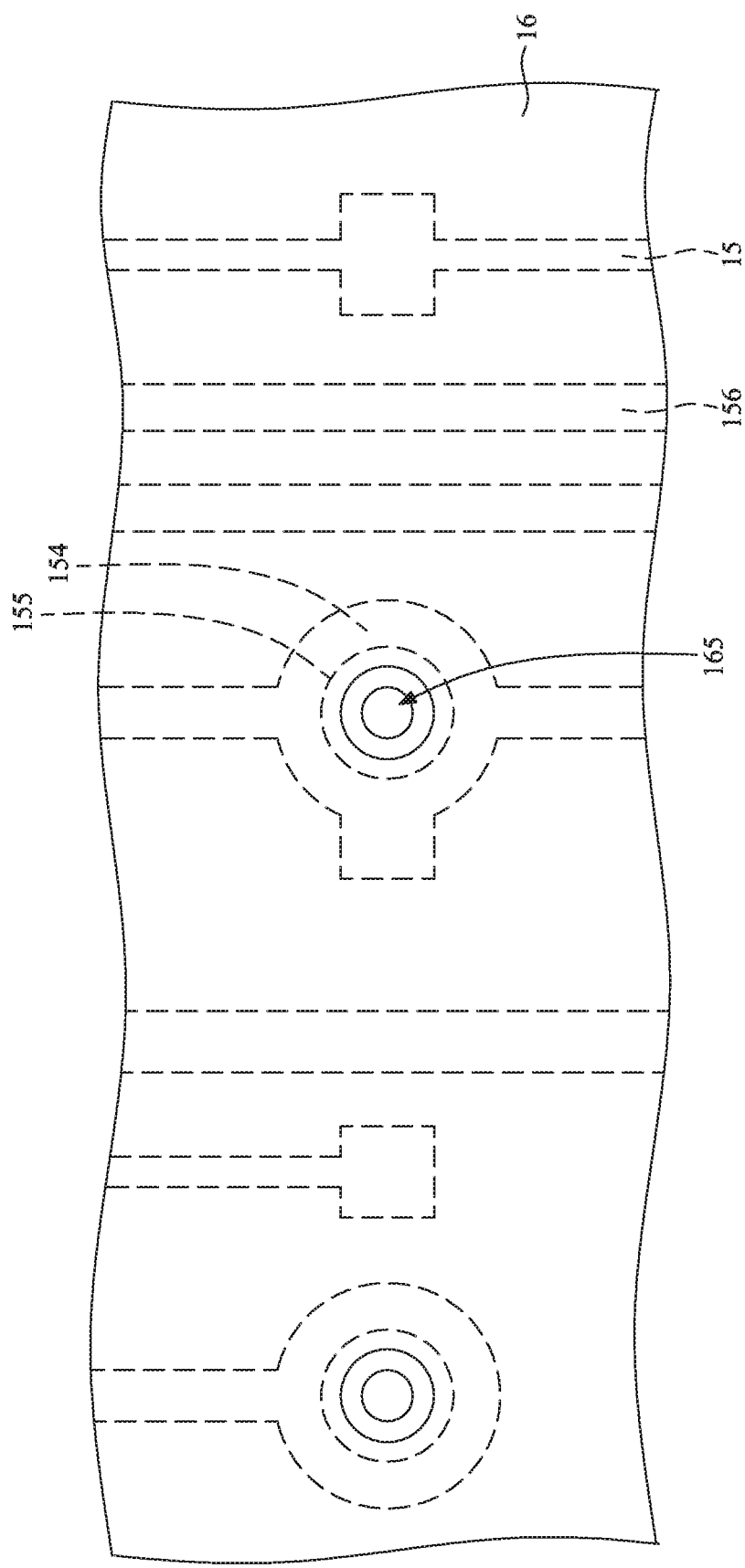
FIG. 18 illustrates one or more stages of an example of a method for manufacturing an assembly structure according to some embodiments of the present disclosure.

Referring to FIG. 17 and FIG. 18, wherein FIG. 18 illustrates a bottom view of FIG. 17, a second dielectric layer 16 is formed or disposed on the first dielectric layer 14 to cover the first circuit layer 15 by, for example, lamination or other suitable techniques. The second dielectric layer 16 includes a first portion 164 (or a protruded portion) disposed in the through hole 143 of the first dielectric layer 14. The first portion 164 of the second dielectric layer 16 in the through hole 143 of the first dielectric layer 14 tapers upward and extends through the first dielectric layer 14. In addition, the first portion 164 of the second dielectric layer 16 in the through hole 143 of the first dielectric layer 14 defines a central hole 165. The central hole 165 tapers upward.

Figure 19:
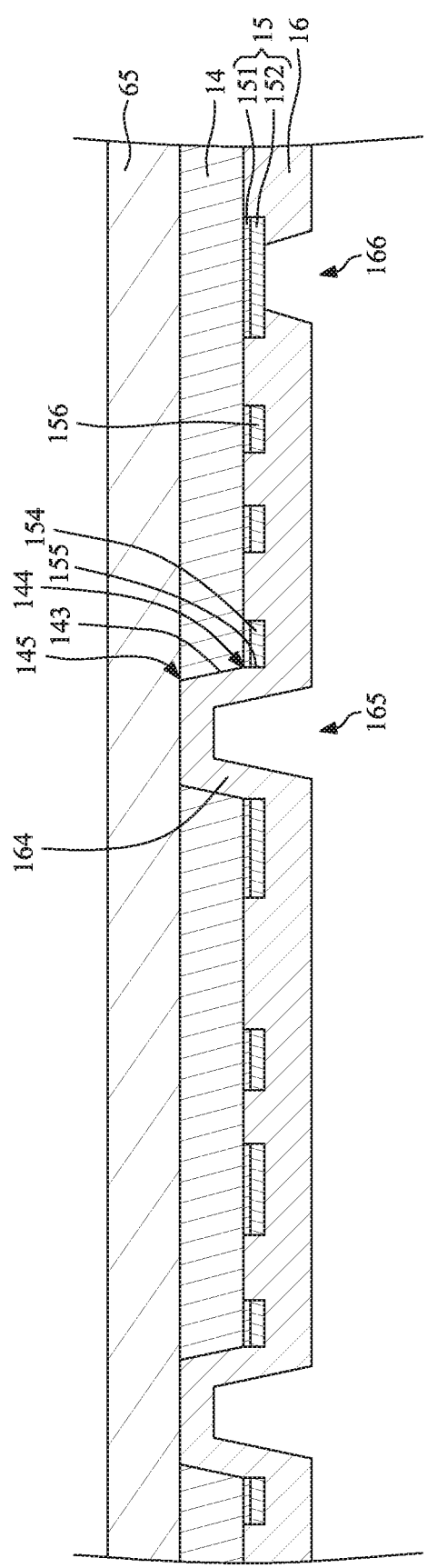
FIG. 19 illustrates one or more stages of an example of a method for manufacturing an assembly structure according to some embodiments of the present disclosure.

Referring to FIG. 19, at least one through hole 166 is formed to extend through the second dielectric layer 16 by, for example, laser drilling or other suitable techniques to expose a portion of the first circuit layer 15.

Figure 20:
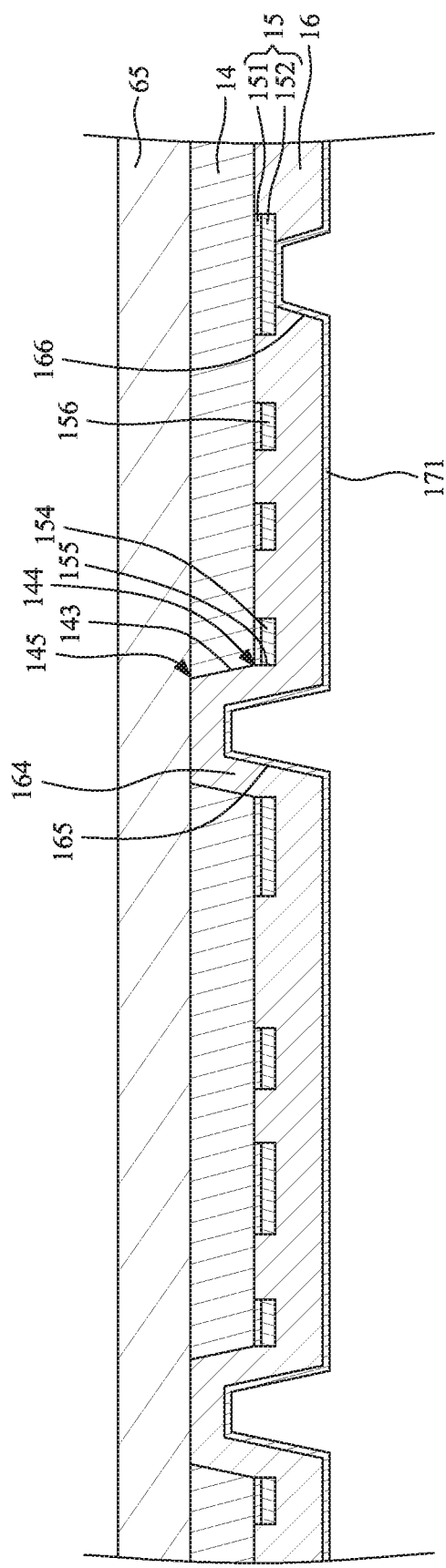
FIG. 20 illustrates one or more stages of an example of a method for manufacturing an assembly structure according to some embodiments of the present disclosure.

Referring to FIG. 20, a seed layer 171 is formed or disposed on the second dielectric layer 16 and in the central hole 165 and the through hole 166 by a PVD technique or other suitable techniques.

Figure 21:
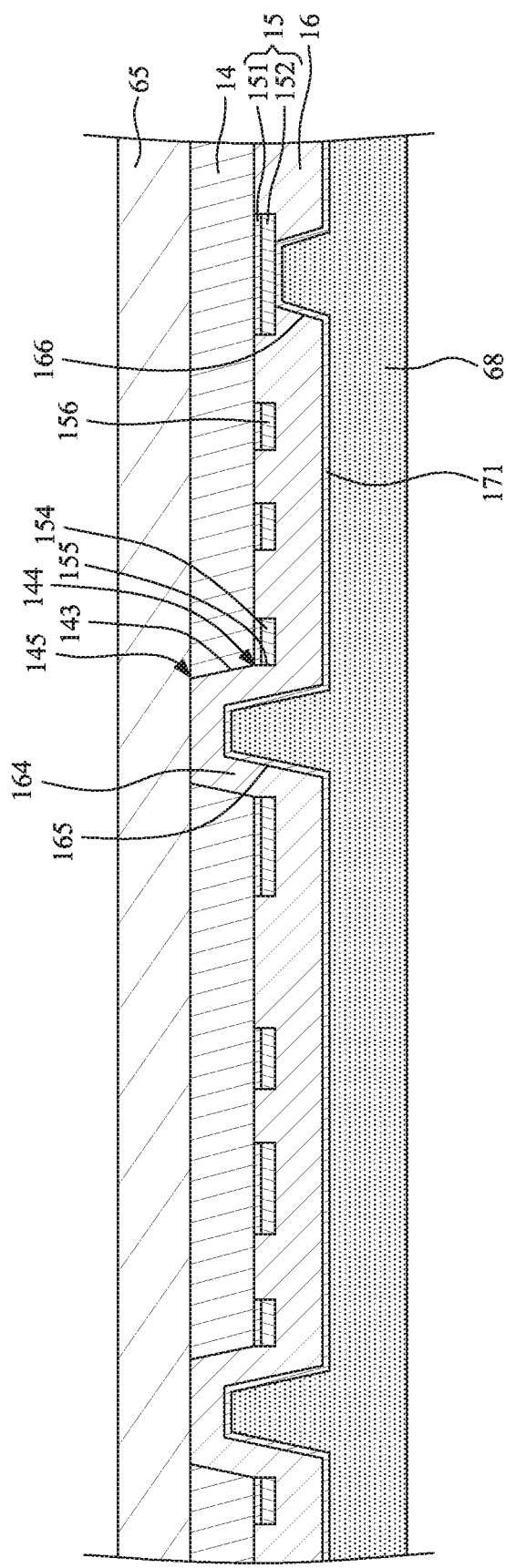
FIG. 21 illustrates one or more stages of an example of a method for manufacturing an assembly structure according to some embodiments of the present disclosure.

Referring to FIG. 21, a photoresist layer 68 is formed or disposed on the seed layer 171 by, for example, lamination.

Figure 22:
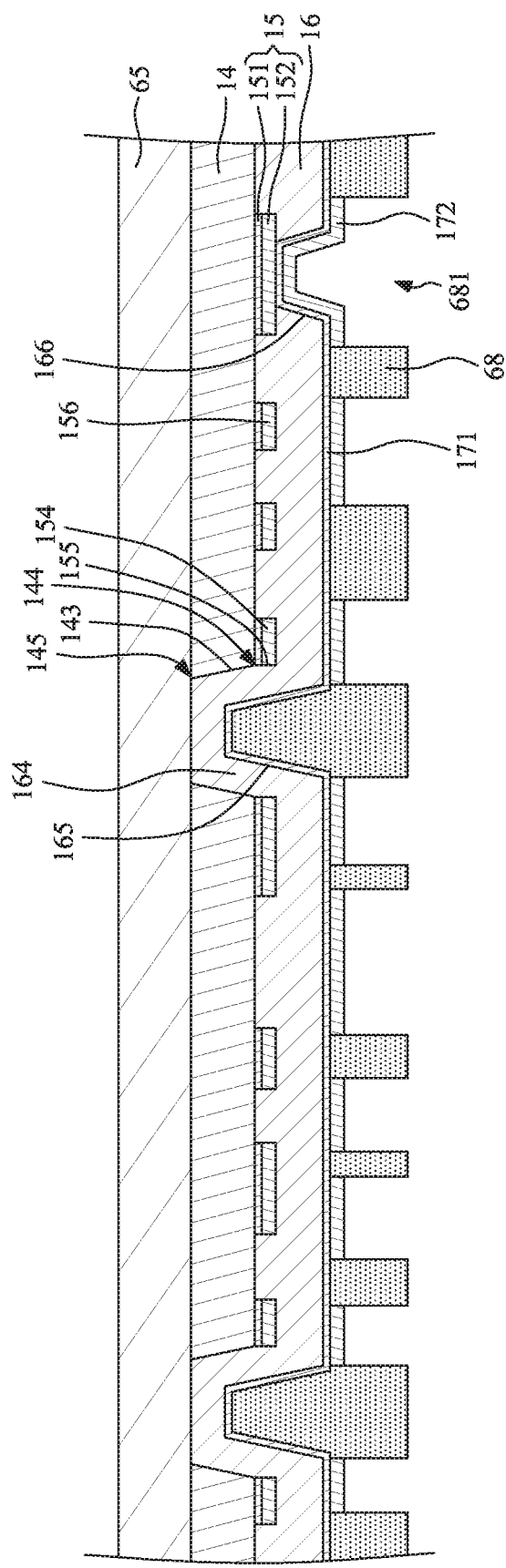
FIG. 22 illustrates one or more stages of an example of a method for manufacturing an assembly structure according to some embodiments of the present disclosure.

Referring to FIG. 22, a plurality of openings 681 are formed in the photoresist layer 68 by an exposure and development technique or other suitable techniques to expose portions of the seed layer 171. Then, a conductive metallic material 172 is formed on the exposed portions of the seed layer 171 in the openings 681 by a plating technique or other suitable techniques.

Figure 23:
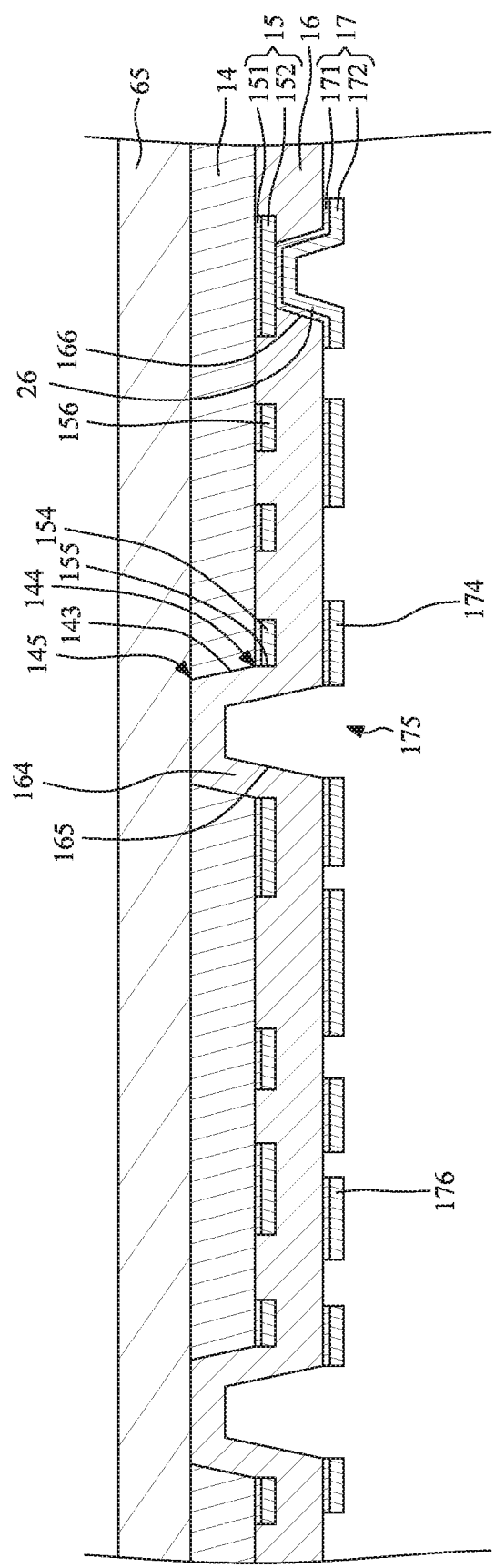
FIG. 23 illustrates one or more stages of an example of a method for manufacturing an assembly structure according to some embodiments of the present disclosure.
Figure 24:
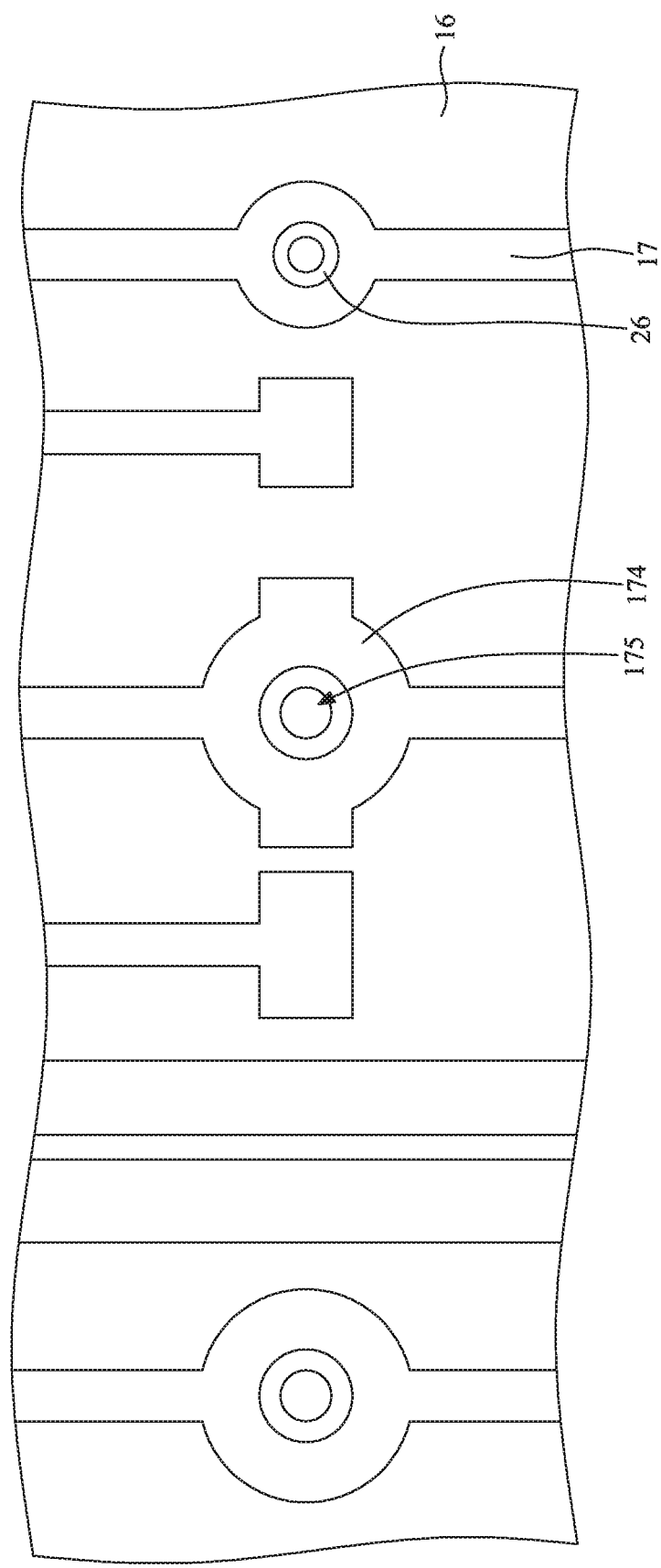
FIG. 24 illustrates one or more stages of an example of a method for manufacturing an assembly structure according to some embodiments of the present disclosure.

Referring to FIG. 23 and FIG. 24, wherein FIG. 24 illustrates a bottom view of FIG. 23, the photoresist layer 68 is removed by a stripping technique or other suitable techniques. Then, the portions of the seed layer 171 that are not covered by the conductive metallic material 172 are moved by an etching technique or other suitable techniques. Meanwhile, a second circuit layer 17 and at least one inner via 26 are formed. The second circuit layer 17 may be a fan-out circuit layer or an RDL, and an L/S of the second circuit layer 17 may be less than or equal to about 10 µm/about 10 µm, or less than or equal to about 5 µm/about 5 µm. In some embodiments, the L/S of the second circuit layer 17 may be greater than or equal to the L/S of the first circuit layer 15.

The second circuit layer 17 is disposed on the second dielectric layer 16. In some embodiments, the second circuit layer 17 may include a seed layer 171 and a conductive metallic material 172 disposed on the seed layer 171. In some embodiments, the second circuit layer 17 may include a first portion 174 and a second portion 176. The first portion 174 of the second circuit layer 17 is disposed adjacent to the central hole 165 of the second dielectric layer 16, and may be in a ring shape. In addition, the second portion 176 of the second circuit layer 17 is far away from the central hole 165 of the second dielectric layer 16. The first portion 174 of the second circuit layer 17 may define a first hole 175 extending through the second circuit layer 17 and corresponding to the central hole 165 of the second dielectric layer 16. In some embodiments, a size of the first hole 175 of the first portion 174 of the second circuit layer 17 may be substantially equal to or greater than a size of the central hole 165 of the second dielectric layer 16. In some embodiments, a diameter (or a width) of the first hole 175 of the first portion 174 of the second circuit layer 17 may be less than or equal to a diameter (or a width) of the first hole 155 of the first portion 154 of the first circuit layer 15.

The at least one inner via 26 may include a plurality of inner via 26. Some of the inner vias 26 are disposed in the through hole 166 of the second dielectric layer 16 to contact the exposed portion of the first circuit layer 15. Thus, the inner vias 26 are disposed between the first circuit layer 15 and the second circuit layer 17 for electrically connecting the first circuit layer 15 and the second circuit layer 17. In some embodiments, some of the inner vias 26 and the second circuit layer 17 may be formed integrally as a monolithic or one-piece structure. Each inner via 26 tapers upward.

Figure 25:
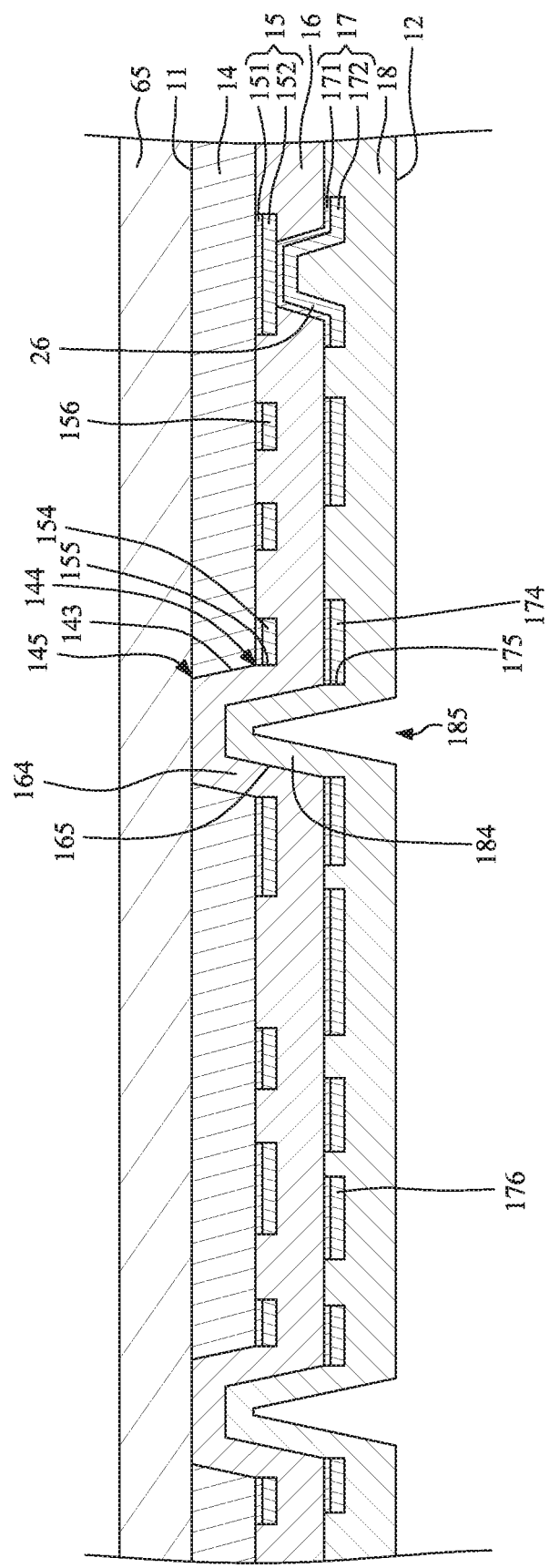
FIG. 25 illustrates one or more stages of an example of a method for manufacturing an assembly structure according to some embodiments of the present disclosure.

Referring to FIG. 25, a third dielectric layer 18 is formed or disposed on the second dielectric layer 16 to cover the second circuit layer 17 by, for example, lamination or other suitable techniques. The third dielectric layer 18 includes a first portion 184 (or a protruded portion) disposed in the central hole 165 of the second dielectric layer 16. The first portion 184 of the third dielectric layer 18 in the central hole 165 of the second dielectric layer 16 tapers upward. In addition, the first portion 184 of the third dielectric layer 18 in the central hole 165 of the second dielectric layer 16 defines a central hole 185. The central hole 185 tapers upward.

Figure 26:
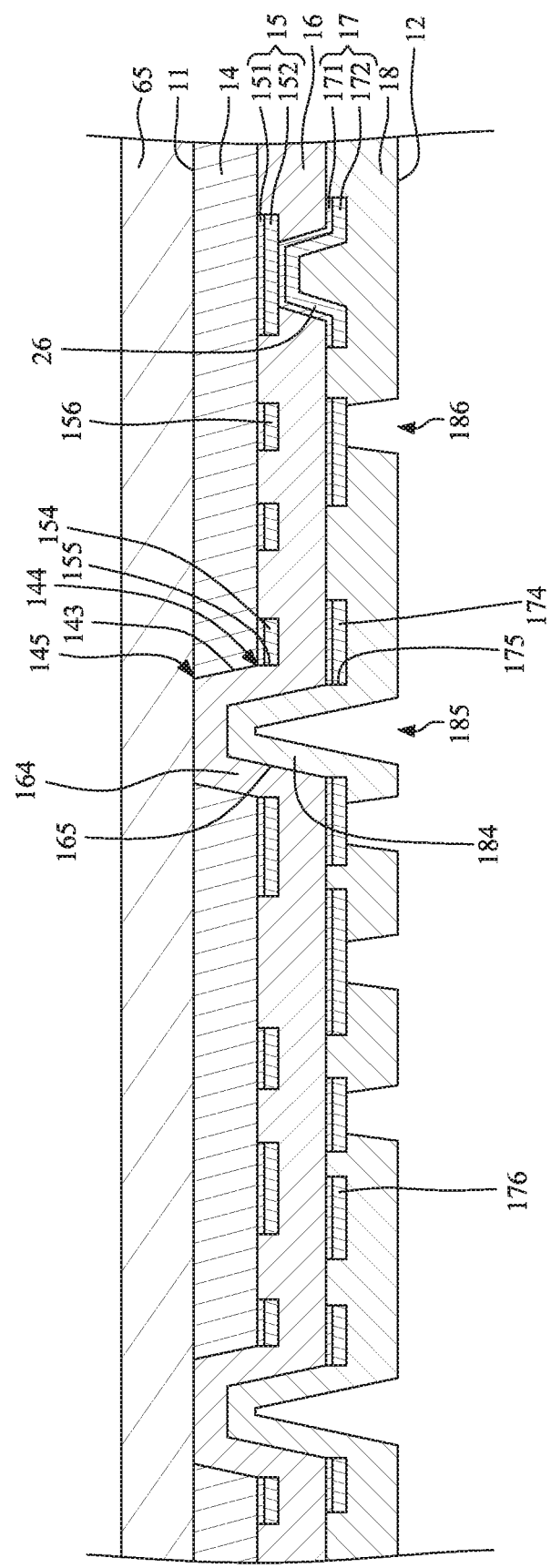
FIG. 26 illustrates one or more stages of an example of a method for manufacturing an assembly structure according to some embodiments of the present disclosure.

Referring to FIG. 26, at least one through hole 186 is formed to extend through the third dielectric layer 18 by, for example, laser drilling or other suitable techniques to expose a portion of the second circuit layer 17.

Figure 27:
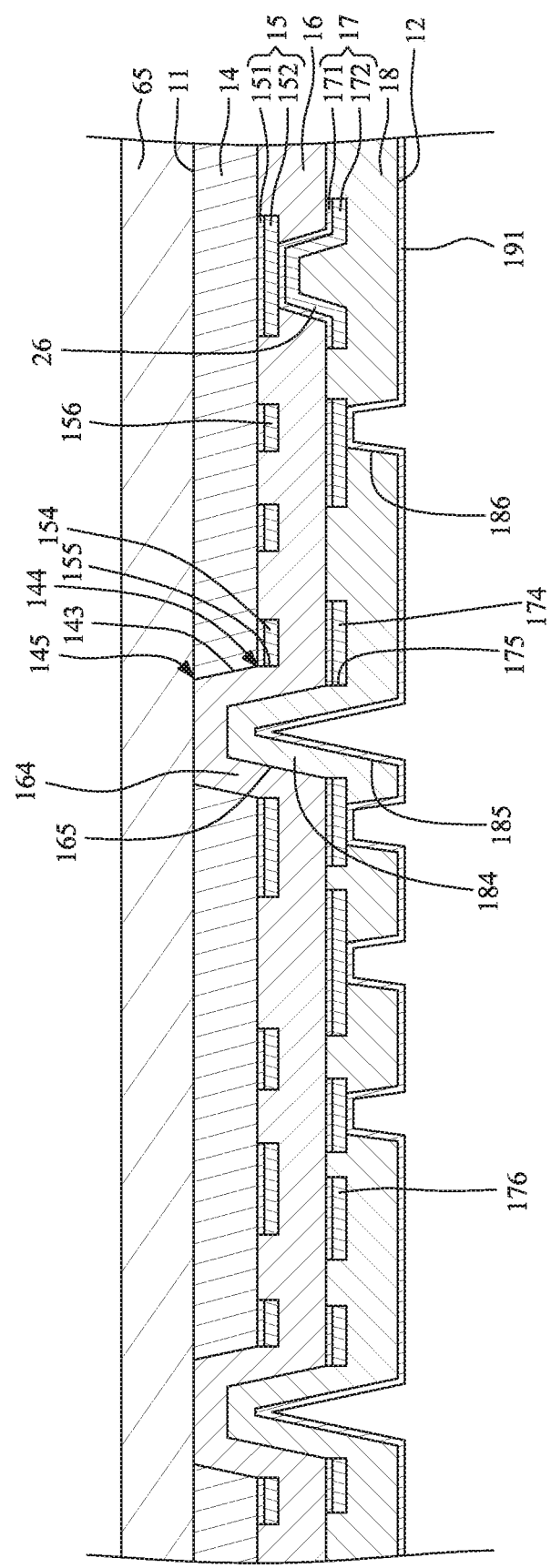
FIG. 27 illustrates one or more stages of an example of a method for manufacturing an assembly structure according to some embodiments of the present disclosure.

Referring to FIG. 27, a seed layer 191 is formed or disposed on the third dielectric layer 18 and in the central hole 185 and the through hole 186 by a PVD technique or other suitable techniques.

Figure 28:
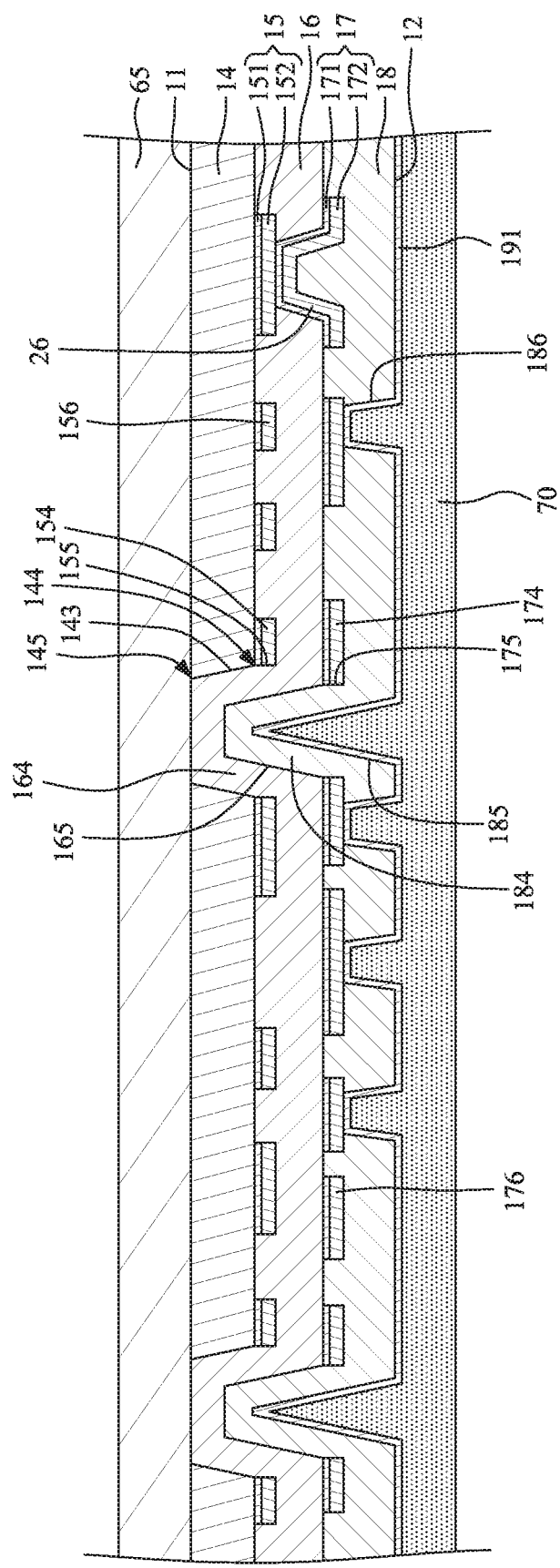
FIG. 28 illustrates one or more stages of an example of a method for manufacturing an assembly structure according to some embodiments of the present disclosure.

Referring to FIG. 28, a photoresist layer 70 is formed or disposed on the seed layer 191 by, for example, lamination.

Figure 29:
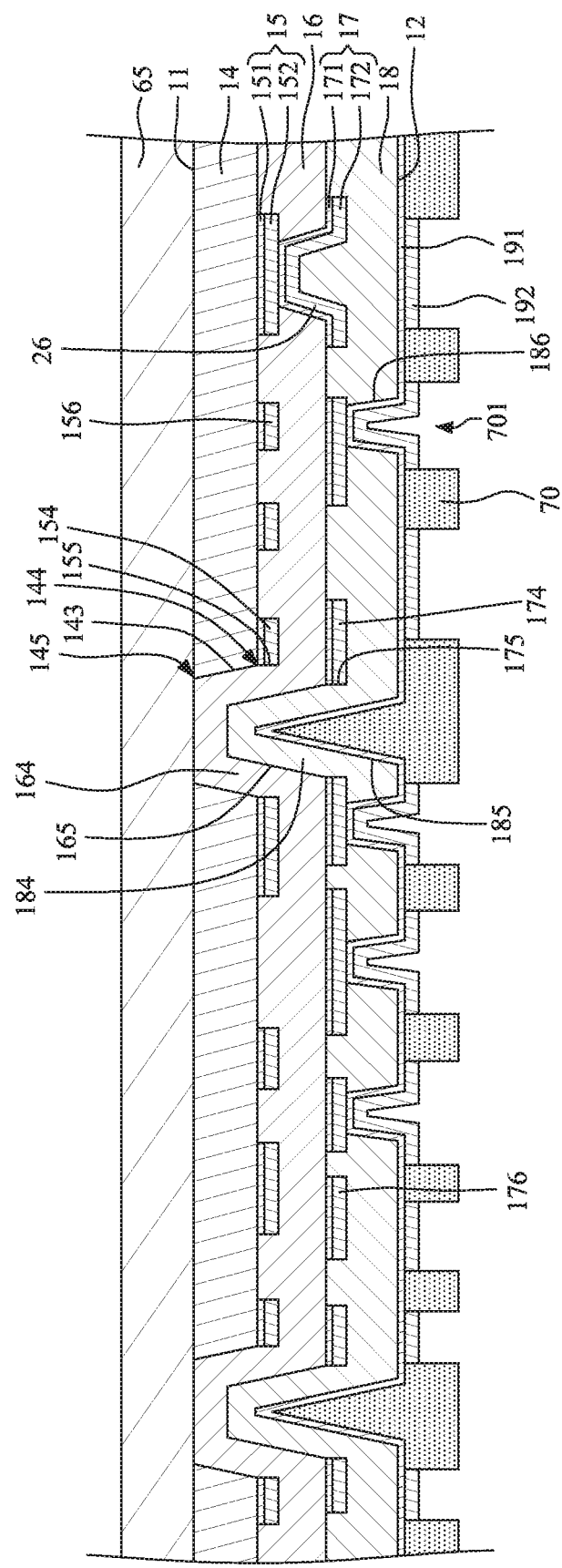
FIG. 29 illustrates one or more stages of an example of a method for manufacturing an assembly structure according to some embodiments of the present disclosure.

Referring to FIG. 29, a plurality of openings 701 are formed in the photoresist layer 70 by an exposure and development technique or other suitable techniques to expose portions of the seed layer 191. Then, a conductive metallic material 192 is formed on the exposed portions of the seed layer 191 in the openings 701 by a plating technique or other suitable techniques.

Figure 30:
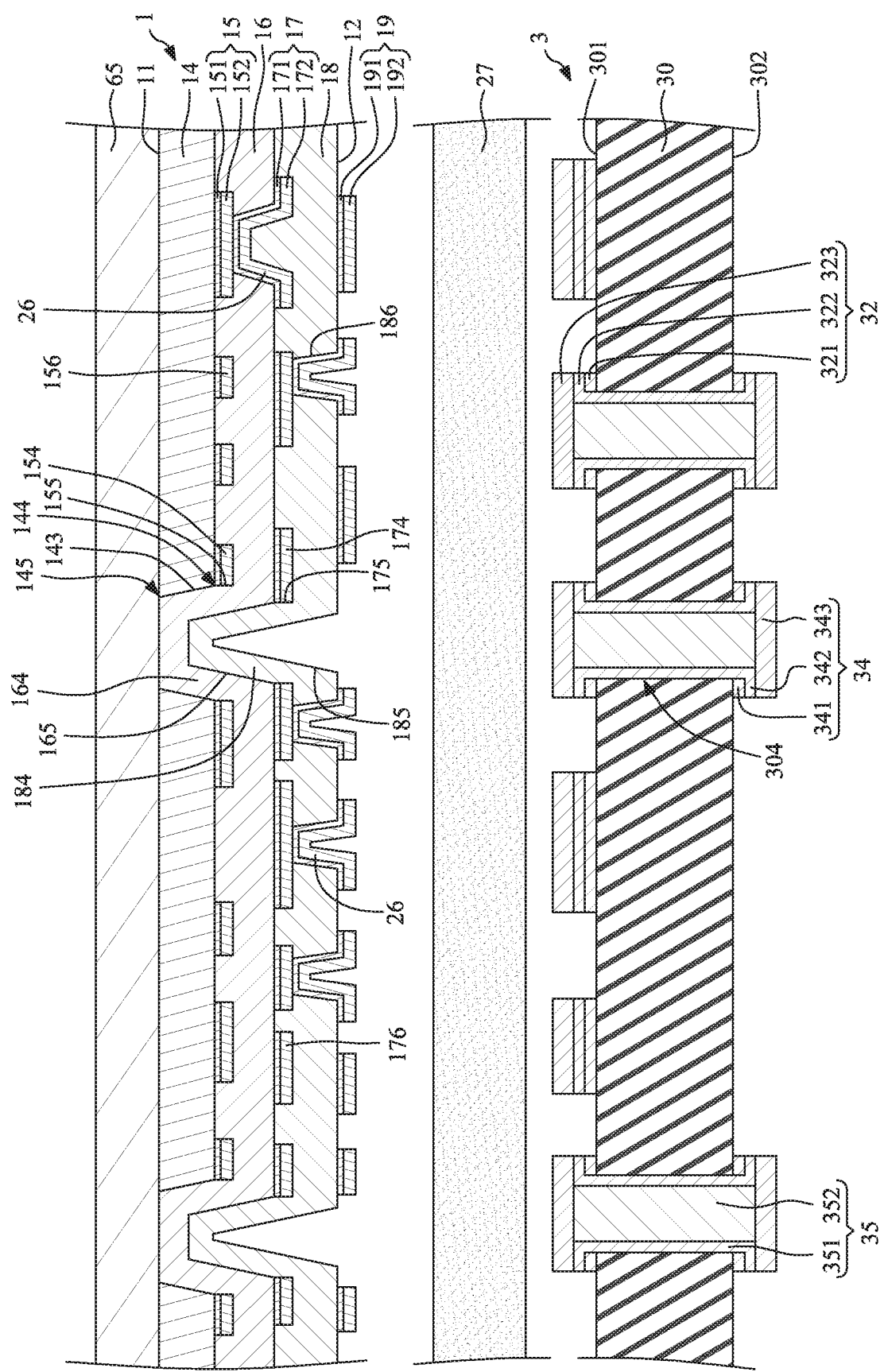
FIG. 30 illustrates one or more stages of an example of a method for manufacturing an assembly structure according to some embodiments of the present disclosure.

Referring to FIG. 30, the photoresist layer 70 is removed by a stripping technique or other suitable techniques. Then, the portions of the seed layer 191 that are not covered by the conductive metallic material 192 are moved by an etching technique or other suitable techniques. Meanwhile, a third circuit layer 19 and at least one inner via 26 are formed, and the upper wiring structure 1 is obtained. The upper wiring structure 1 has a top surface 11 and a bottom surface 12 opposite to the top surface 11. The third circuit layer 19 may be a fan-out circuit layer or an RDL, and an L/S of the second circuit layer 19 may be less than or equal to about 15 µm/about 15 µm, or less than or equal to about 10 µm/about 10 µm. In some embodiments, the L/S of the third circuit layer 19 may be greater than or equal to the L/S of the second circuit layer 17.

The third circuit layer 19 is disposed on and protrudes from the third dielectric layer 18. In some embodiments, the third circuit layer 19 may include a seed layer 191 and a conductive metallic material 192 disposed on the seed layer 191. The at least one inner via 26 may include a plurality of inner via 26. Some of the inner vias 26 are disposed in the through hole 186 of the third dielectric layer 18 to contact the exposed portion of the second circuit layer 17. Thus, the inner vias 26 are disposed between the second circuit layer 17 and the third circuit layer 19 for electrically connecting the second circuit layer 17 and the third circuit layer 19. In some embodiments, some of the inner vias 26 and the third circuit layer 19 may be formed integrally as a monolithic or one-piece structure. Each inner via 26 tapers upward.

Then, an intermediate layer 27 and a lower wiring structure 3 are provided. The lower wiring structure 3 includes at least one dielectric layer 30 and at least one circuit layer (including, for example, an upper circuit layer 32 and a lower circuit layer 34 formed of a metal, a metal alloy, or other conductive material) in contact with the dielectric layer 30.

The dielectric layer 30 has a top surface 301 and a bottom surface 302 opposite to the top surface 301, and defines a plurality of through holes 304 extending through the dielectric layer 30. An interconnection via 35 is disposed or formed in each through hole 304 for vertical connection. The upper circuit layer 32 is formed or disposed on and protrudes from the top surface 301 of the dielectric layer 30. In some embodiments, the upper circuit layer 32 may include a first metallic layer 321, a second metallic layer 322 and a third metallic layer 323. In addition, the lower circuit layer 34 is formed or disposed on and protrudes from the bottom surface 302 of the dielectric layer 30. In some embodiments, the lower circuit layer 34 may include a first metallic layer 341, a second metallic layer 342 and a third metallic layer 343. In some embodiments, each interconnection via 35 electrically connects the upper circuit layer 32 and the lower circuit layer 34. The base metallic layer 351 of the interconnection via 35, the second metallic layer 322 of the upper circuit layer 32 and the second metallic layer 342 the lower circuit layer 34 may be formed integrally and concurrently as a monolithic or one-piece structure.

Figure 31:
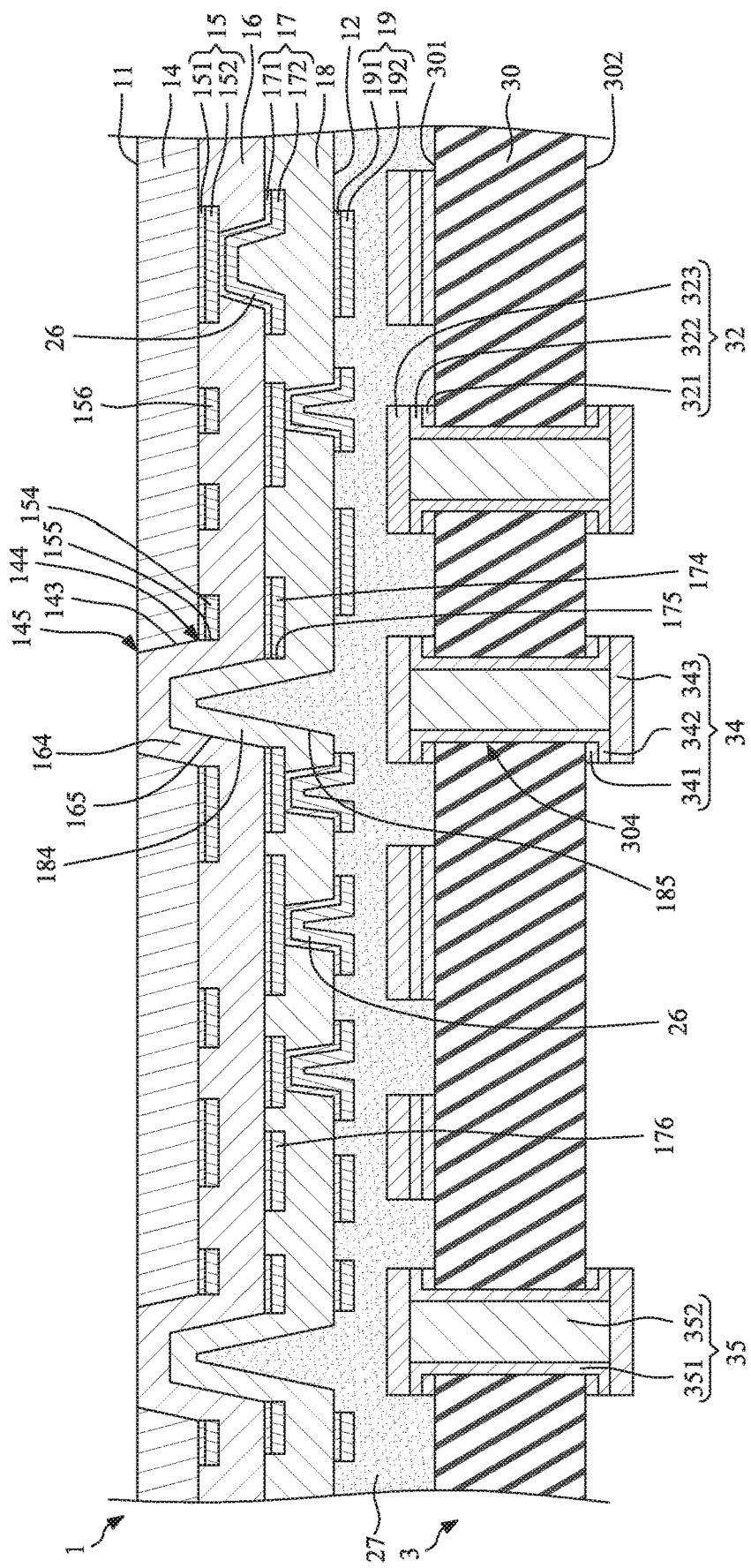
FIG. 31 illustrates one or more stages of an example of a method for manufacturing an assembly structure according to some embodiments of the present disclosure.

Referring to FIG. 31, the lower wiring structure 3 may be attached to the upper wiring structure 1 through the intermediate layer 27. That is, the intermediate layer 27 may be interposed or disposed between the upper wiring structure 1 and the lower wiring structure 3 to bond the upper wiring structure 1 and the lower wiring structure 3 together. In some embodiments, the intermediate layer 27 may be an adhesion layer that is cured from an adhesive material (e.g., includes a cured adhesive material such as an adhesive polymeric material). Thus, the third circuit layer 19 of the upper wiring structure 1 and the upper circuit layer 32 of the lower wiring structure 3 are embedded in the intermediate layer 27. In some embodiments, a portion of the intermediate layer 27 may extend into the central hole 185 of the first portion 184 of the third dielectric layer 18.

Then, the carrier 65 is removed. Thus, a top portion of the first portion 164 of the second dielectric layer 16 may be exposed.

Figure 32:
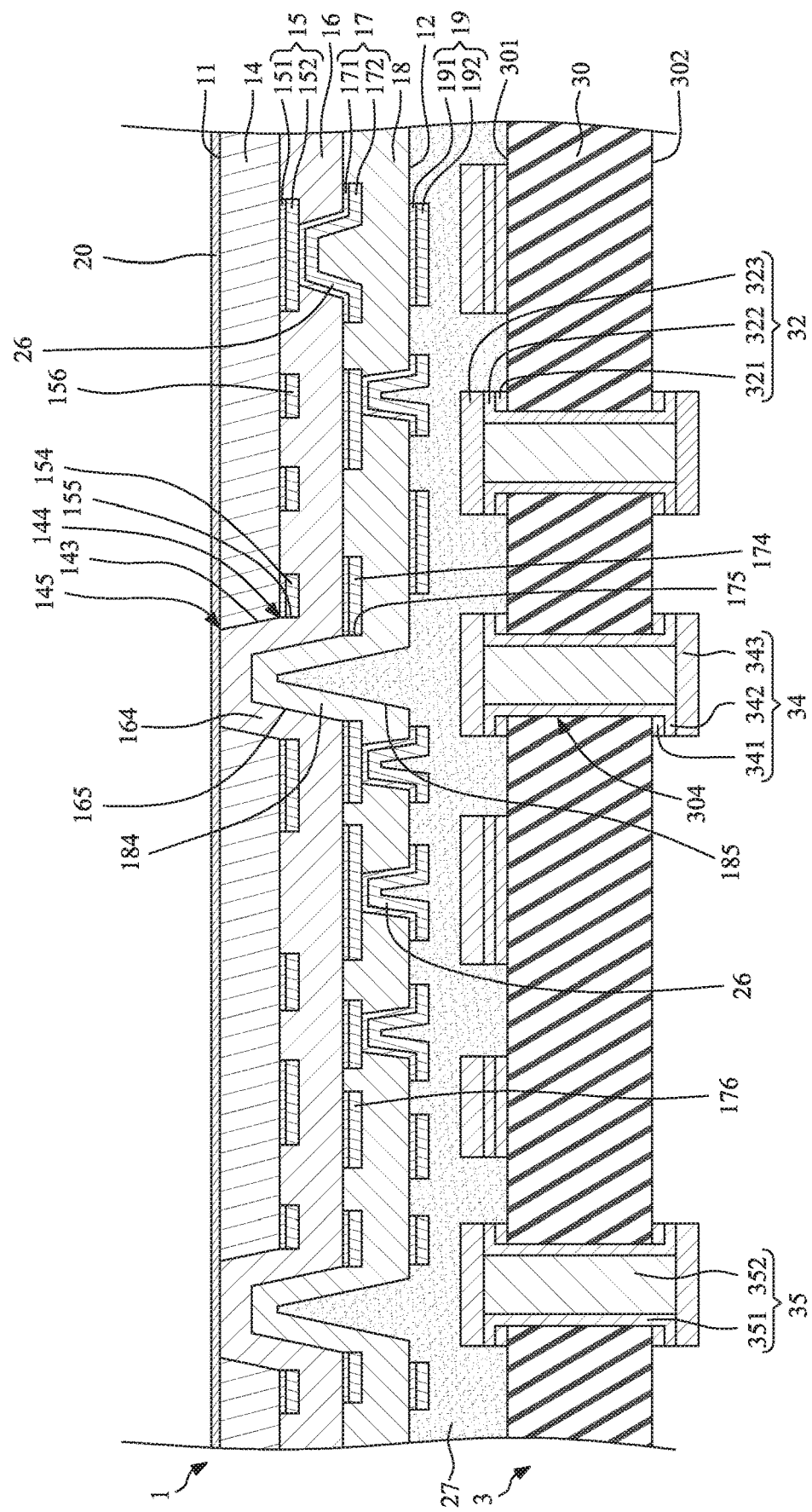
FIG. 32 illustrates one or more stages of an example of a method for manufacturing an assembly structure according to some embodiments of the present disclosure.

Referring to FIG. 32, a mask layer 20 is formed on the top surface 11 of the upper wiring structure 1 by a PVD technique or other suitable techniques.

Figure 33:
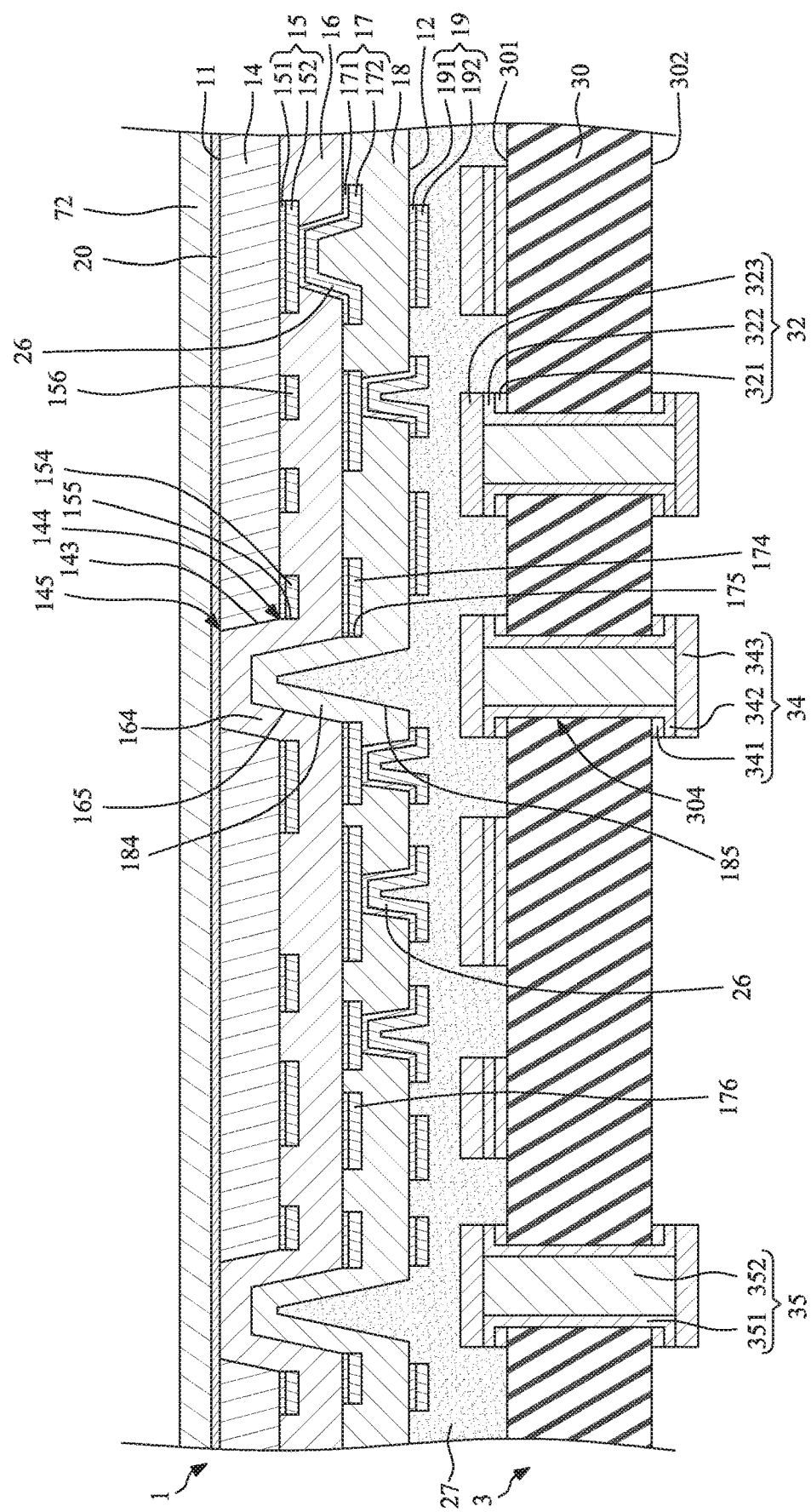
FIG. 33 illustrates one or more stages of an example of a method for manufacturing an assembly structure according to some embodiments of the present disclosure.

Referring to FIG. 33, a photoresist layer 72 is formed or disposed on the mask layer 20 by, for example, lamination.

Figure 34:
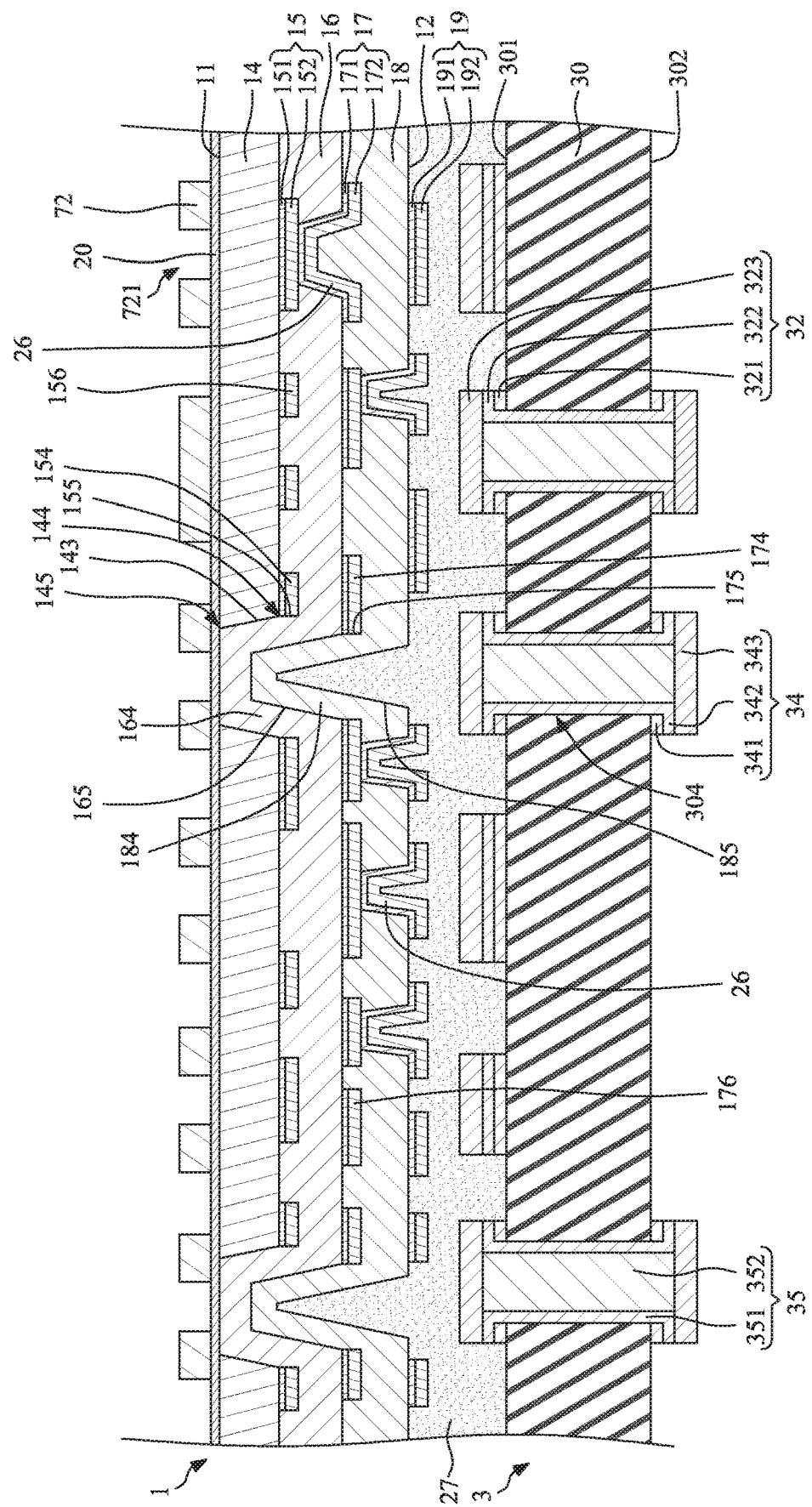
FIG. 34 illustrates one or more stages of an example of a method for manufacturing an assembly structure according to some embodiments of the present disclosure.

Referring to FIG. 34, a plurality of openings 721 are formed in the photoresist layer 72 by an exposure and development technique or other suitable techniques to expose portions of the mask layer 20.

Figure 35:
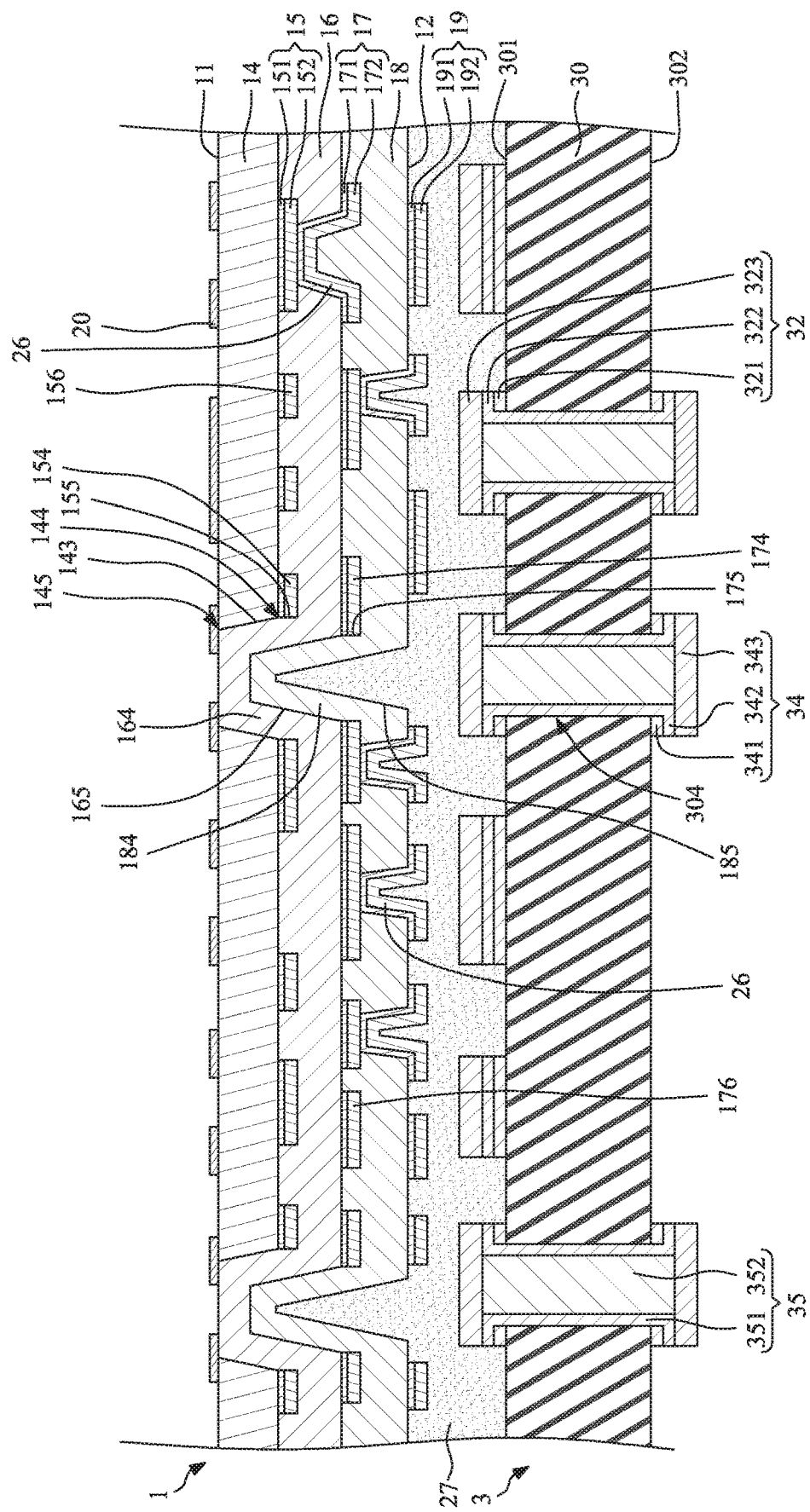
FIG. 35 illustrates one or more stages of an example of a method for manufacturing an assembly structure according to some embodiments of the present disclosure.

Referring to FIG. 35, the exposed portions of the mask layer 20 that are not covered by the photoresist layer 72 are moved by an etching technique or other suitable techniques. Thus, a patterned mask layer 20 is formed on the top surface 11 of the upper wiring structure 1. Then, the photoresist layer 72 is removed by a stripping technique or other suitable techniques.

Figure 36:
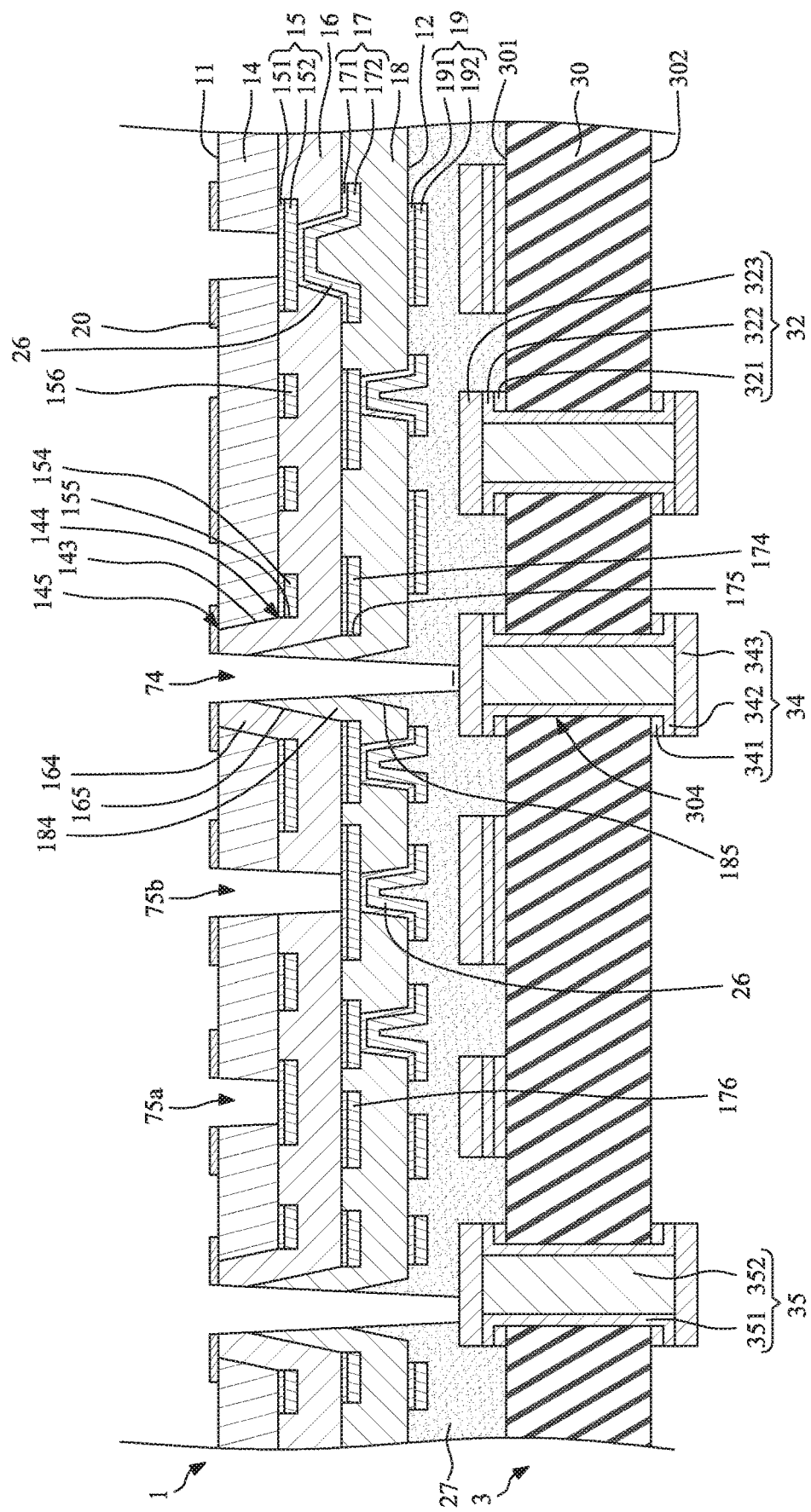
FIG. 36 illustrates one or more stages of an example of a method for manufacturing an assembly structure according to some embodiments of the present disclosure.

Referring to FIG. 36, at least one through hole 74 is formed to extend through the patterned mask layer 20 and the upper wiring structure 1 by, for example, laser drilling or other suitable techniques to expose a portion of the lower wiring structure 3. As shown in FIG. 36, the through hole 74 extends through the first portion 164 of the second dielectric layer 16, the first portion 184 of the third dielectric layer 18 and the intermediate layer 27, and stops and terminates at the upper circuit layer 32 of the lower wiring structure 3.

Further, at least one first opening 75a is formed to extend through the patterned mask layer 20 and the first dielectric layer 14 to expose a portion of the first circuit layer 15. In addition, at least one second opening 75b is formed to extend through the patterned mask layer 20, the first dielectric layer 14 and the second dielectric layer 16 to expose a portion of the second circuit layer 17.

As shown in FIG. 35, the first portion 164 of the second dielectric layer 16 is disposed in the through hole 143 of the first dielectric layer 14 to form a truncated cone. Thus, the boundary between the second dielectric layer 16 and the first dielectric layer 14 is not a substantially flat plane. For example, there is an inclination angle between a portion of the boundary (e.g., the bottom surface of the first dielectric layer 14) between the second dielectric layer 16 and the first dielectric layer 14 and another portion of the boundary (e.g., the sidewall surface of the through hole 143 of the first dielectric layer 14) between the second dielectric layer 16 and the first dielectric layer 14. Thus, as shown in FIG. 36, during a formation process of the though hole 74, the two stacked dielectric layers (the second dielectric layer 16 and the first dielectric layer 14) will not delaminate from each other readily since the truncated cone shape of the first portion 164 of the second dielectric layer 16 may withstand the stresses during drilling process. Similarly, the first portion 184 of the third dielectric layer 18 is disposed in the central hole 165 of the second dielectric layer 16 to form a truncated cone. Thus, during a formation process of the though hole 74, the two stacked dielectric layers (the second dielectric layer 16 and the third dielectric layer 18) will not delaminate from each other readily. Thus, the quality of the though hole 74 is improved.

Figure 37:
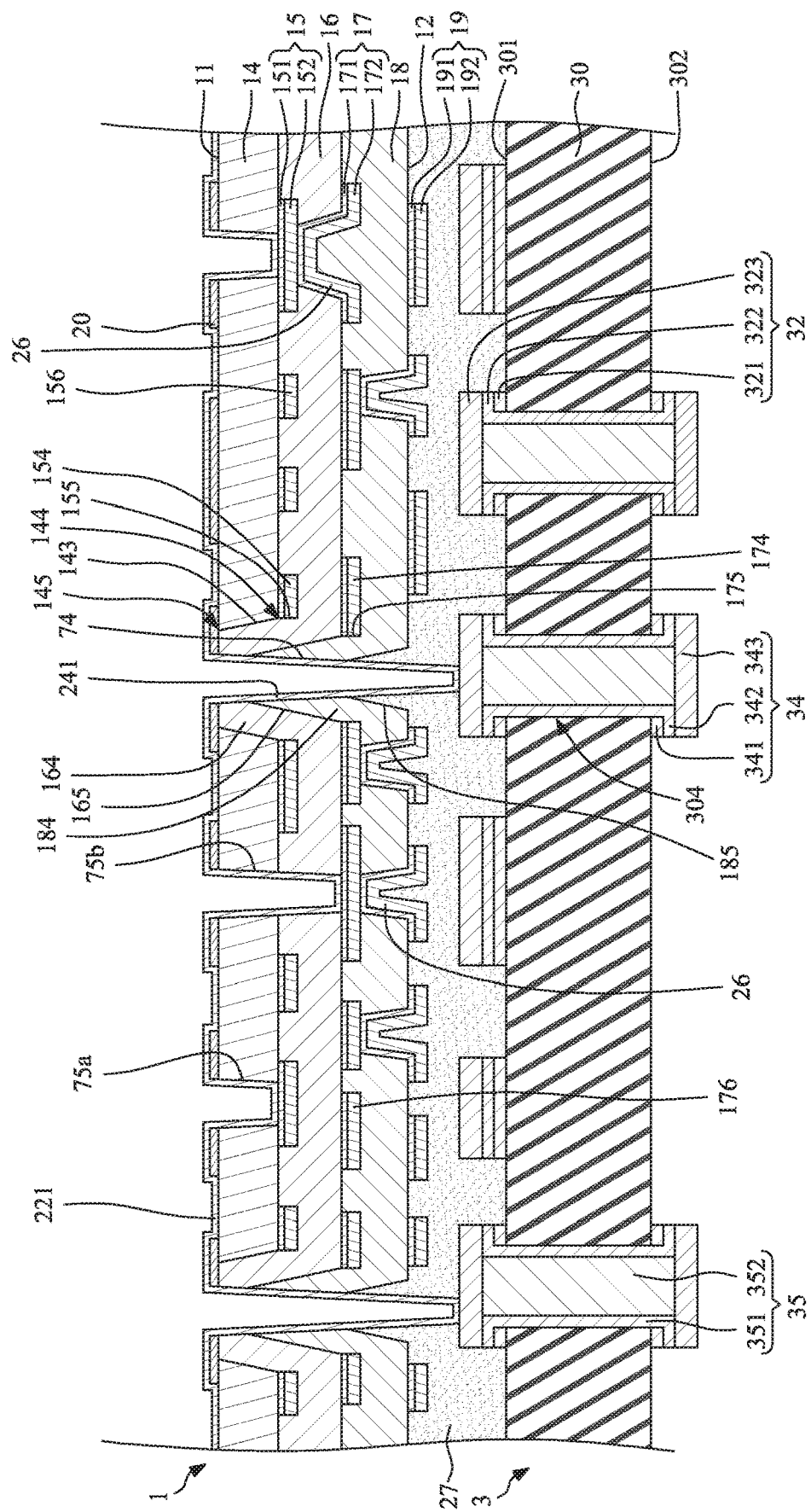
FIG. 37 illustrates one or more stages of an example of a method for manufacturing an assembly structure according to some embodiments of the present disclosure.

Referring to FIG. 37, a first metal layer 221 is formed or disposed on the patterned mask layer 20 and the first dielectric layer 14, and in the though hole 74, the first opening 75a and the second opening 75b by a PVD technique or other suitable techniques. In some embodiments, the first metal layer 221 in the though hole 74 is referred to as a seed layer 241.

Figure 38:
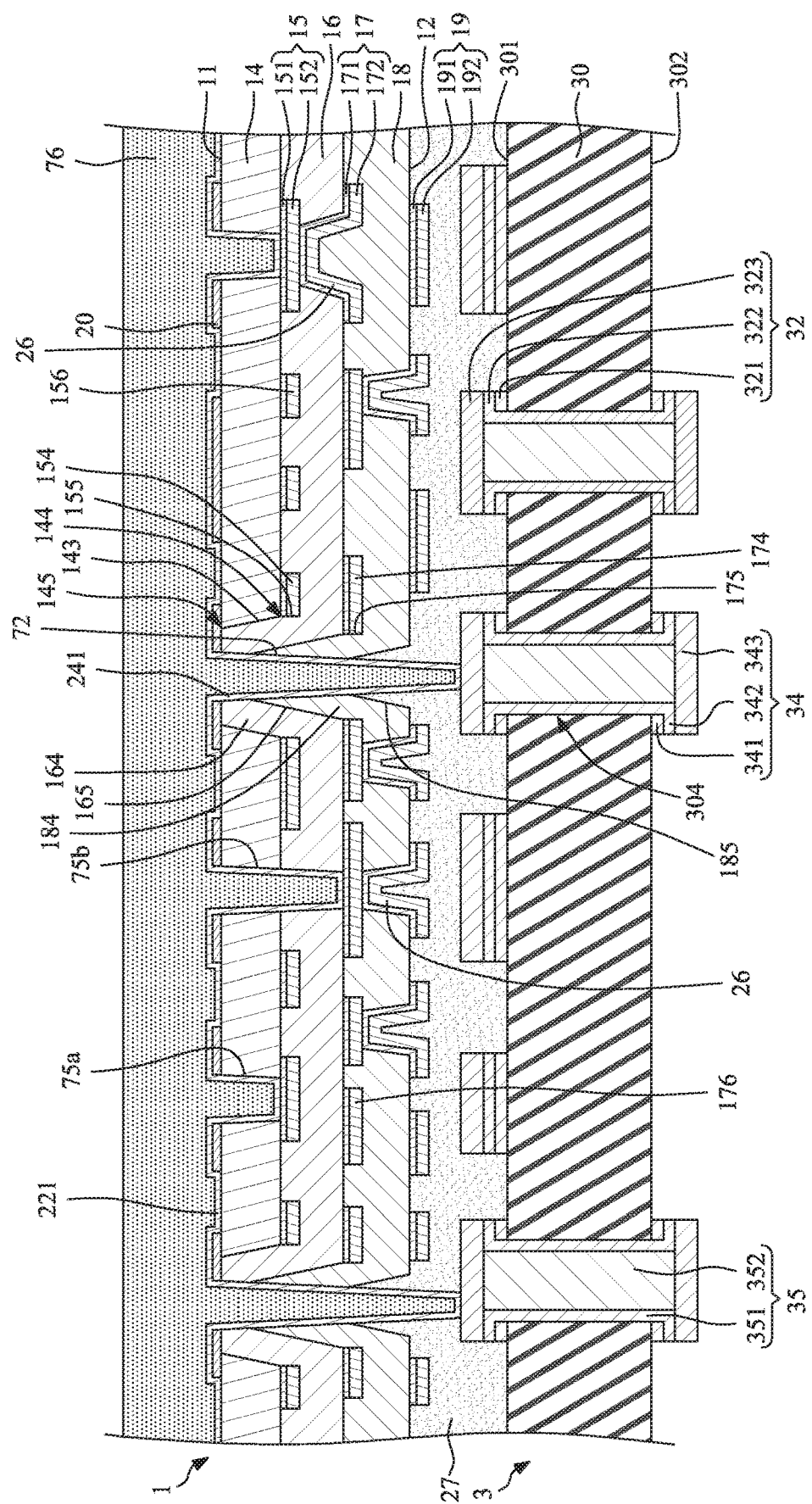
FIG. 38 illustrates one or more stages of an example of a method for manufacturing an assembly structure according to some embodiments of the present disclosure.

Referring to FIG. 38, a photoresist layer 76 is formed or disposed on the first metal layer 221 by, for example, lamination.

Figure 39:
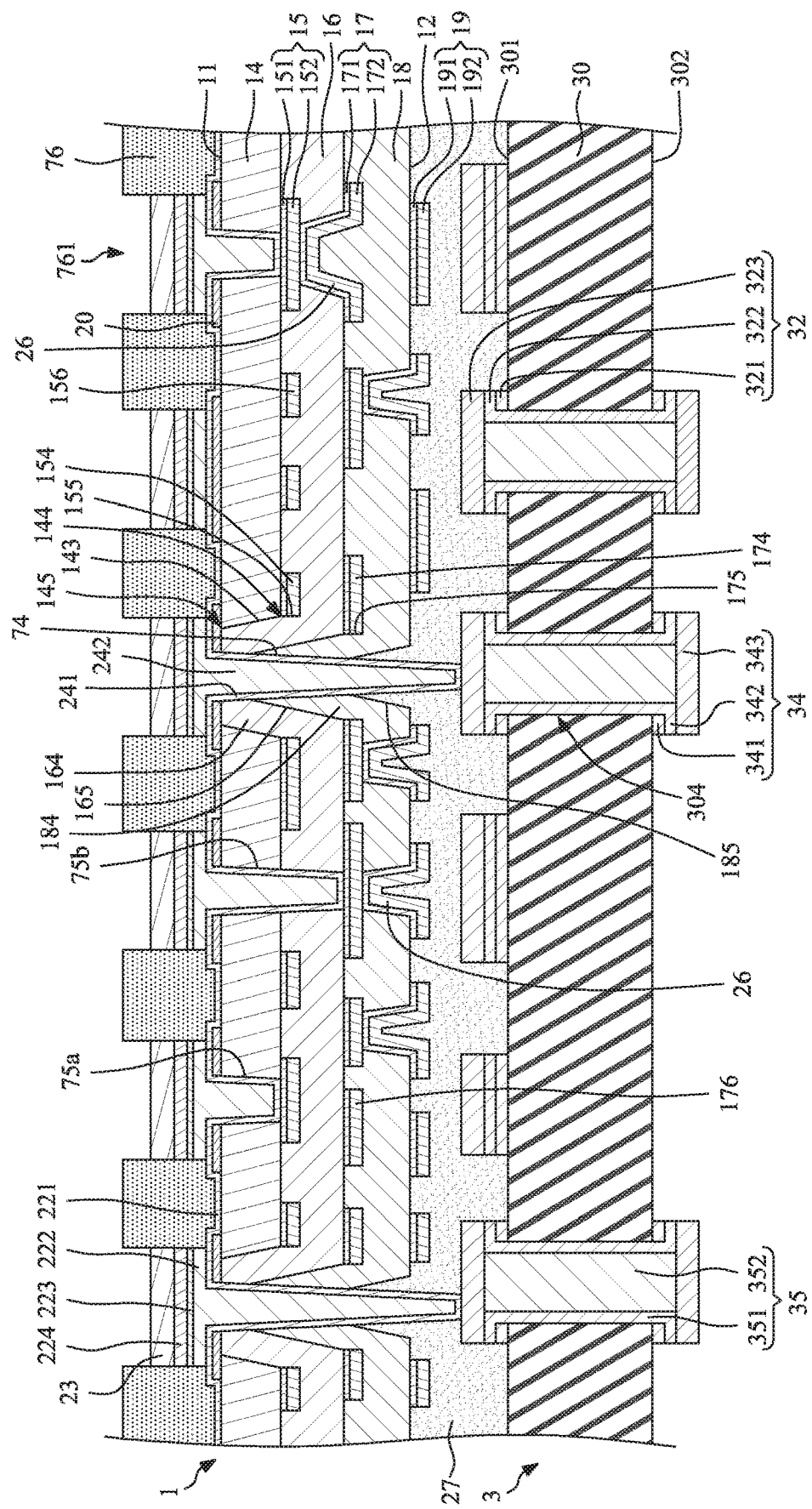
FIG. 39 illustrates one or more stages of an example of a method for manufacturing an assembly structure according to some embodiments of the present disclosure.

Referring to FIG. 39, a plurality of openings 761 are formed in the photoresist layer 76 by an exposure and development technique or other suitable techniques to expose portions of the first metal layer 221. Then, a second metal layer 222, a third metal layer 223, a third metal layer 224 and an external connector 23 are formed or disposed on the exposed first metal layer 221 in the openings 761 in sequence by a plating technique or other suitable techniques. In some embodiments, the second metal layer 222 in the though hole 74 is referred to as a conductive metallic material 242.

Figure 40:
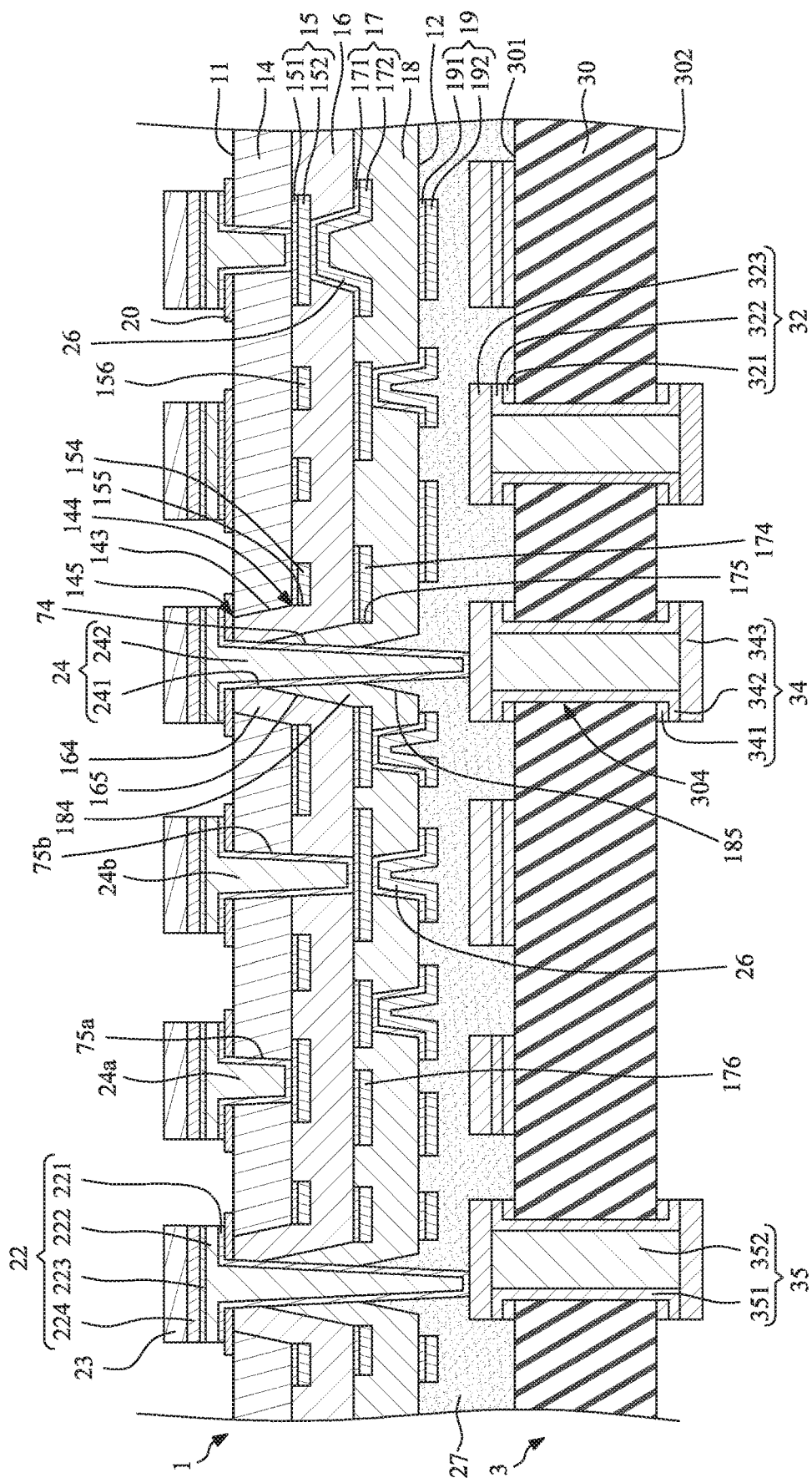
FIG. 40 illustrates one or more stages of an example of a method for manufacturing an assembly structure according to some embodiments of the present disclosure.

Referring to FIG. 40, the photoresist layer 76 is removed by a stripping technique or other suitable techniques. Then, the portions of the first metal layer 221 that are not covered by the second metal layer 222, the third metal layer 223, the third metal layer 224 and the external connector 23 are moved by an etching technique or other suitable techniques. Meanwhile, an outer circuit layer 22, at least one conductive via 24, at least one first inner conductive via 24a and at least one second inner conductive via 24b are formed. The outer circuit layer 22 is disposed on the patterned mask layer 20, and on the top surface 11 of the upper wiring structure 1. The outer circuit layer 22 is electrically connected to the conductive via 24, the first inner conductive via 24a and the second inner conductive via 24b. In some embodiments, the outer circuit layer 22, the conductive via 24, the first inner conductive via 24a and the second inner conductive via 24b are formed concurrently and integrally. In some embodiments, the outer circuit layer 22 may include the first metal layer 221, the second metal layer 222, the third metal layer 223 and the fourth metal layer 224.

The conductive via 24 extends through the patterned mask layer 20, the upper wiring structure 1 and the intermediate layer 27, and is electrically connected to and contacts the circuit layer 32 of the lower wiring structure 3. In some embodiments, the conductive via 24 may extend through the first portion 164 of the second dielectric layer 16 in the through hole 143 of the first dielectric layer 14, and extends through the first portion 184 of the third dielectric layer 18 in the central hole 165 of the second dielectric layer 16. The conductive via 24 may extend through the first hole 155 of the first portion 154 of the first circuit layer 15 without contacting the first portion 154 of the first circuit layer 15. Further, the conductive via 24 may extend through the first hole 175 of the first portion 174 of the second circuit layer 17 without contacting the first portion 174 of the second circuit layer 15. Thus, the conductive via 24 is electrically isolated from the first circuit layer 15 and the second circuit layer 17.

The conductive via 24 may include a seed layer 241 and a conductive metallic material 242 disposed on the seed layer 241. The conductive via 24 may taper downward. Thus, a tapering direction of the conductive via 24 may be different from a tapering direction of the first portion 164 of the second dielectric layer 16 in the through hole 143 of the first dielectric layer 14. In some embodiments, the conductive via 24 may be disposed in a high-density region of the upper wiring structure 1. Since the quality of the though hole 74 is improved, the yield of the conductive via 24 is further improved.

The structures and materials of the first inner conductive via 24a and the second inner conductive via 24b may be similar to the structure and material of the conductive via 24. The first inner conductive via 24a extends through the first dielectric layer 14, and is electrically connected to and contacts the first circuit layer 15. The second inner conductive via 24b extends through the first dielectric layer 14 and the second dielectric layer 16, and is electrically connected to and contacts the second circuit layer 17.

Figure 41:
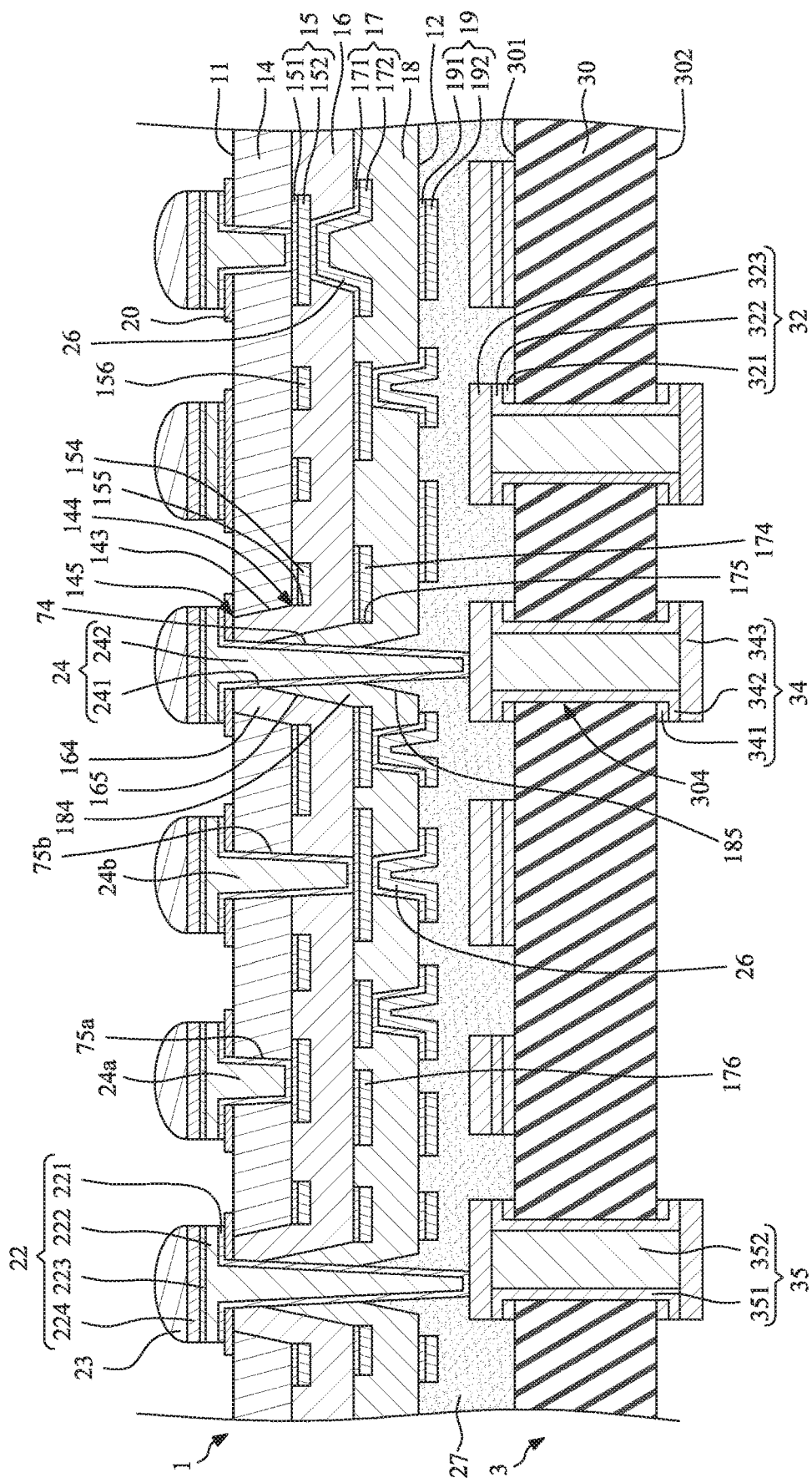
FIG. 41 illustrates one or more stages of an example of a method for manufacturing an assembly structure according to some embodiments of the present disclosure.

Referring to FIG. 41, a reflow process may be conducted so that the external connector 23 is melt to become a hemisphere shape.

Then, a singulation process may be conducted to obtain a plurality of assembly structures 4 of FIG. 1 to FIG. 3.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
a first dielectric layer defining at least one through hole;
a first circuit layer disposed on the first dielectric layer;
a second dielectric layer disposed on the first dielectric layer to cover the first circuit layer, wherein a first portion of the second dielectric layer is disposed in the through hole of the first dielectric layer; and
a conductive via extending through the first portion of the second dielectric layer in the through hole of the first dielectric layer, and electrically isolated from the first circuit layer.

2. The wiring structure of claim 1, wherein the through hole of the first dielectric layer tapers upward.

3. The wiring structure of claim 1, wherein the first portion of the second dielectric layer in the through hole of the first dielectric layer tapers upward and extends through the first dielectric layer.

4. The wiring structure of claim 1, wherein the first portion of the second dielectric layer in the through hole of the first dielectric layer is disposed between the first circuit layer and the conductive via.

5. The wiring structure of claim 1, wherein the first circuit layer includes a first portion disposed adjacent to the through hole of the first dielectric layer, and the first portion surrounds the conductive via.

6. The wiring structure of claim 5, wherein the first portion of the first circuit layer defines a first hole extending through the first circuit layer and corresponding to the through hole of the first dielectric layer, and the first portion of the second dielectric layer is disposed between the conductive via and a sidewall of the first hole.

7. The wiring structure of claim 1, wherein the first portion of the second dielectric layer in the through hole of the first dielectric layer defines a central hole; and the wiring structure further comprises a third dielectric layer disposed on the second dielectric layer and in the central hole of the second dielectric layer.

8. The wiring structure of claim 7, further comprising a second circuit layer disposed on the second dielectric layer and covered by the third dielectric layer, wherein the second circuit layer includes a first portion disposed adjacent to the central hole of the second dielectric layer and electrically isolated from the conductive via.

9. The wiring structure of claim 8, wherein the first portion of the second circuit layer defines a first hole extending through the second circuit layer and corresponding to the central hole of the second dielectric layer.

10. The wiring structure of claim 9, wherein a first portion of the first circuit layer defines a first hole extending through the first circuit layer and corresponding to the through hole of the first dielectric layer, and a diameter of the first hole of the first portion of the second circuit layer is less than or equal to a diameter of the first hole of the first portion of the first circuit layer.

11. The wiring structure of claim 7, wherein the first portion of the second dielectric layer and a first portion of the third dielectric layer are disposed between the first circuit layer and the conductive via.

12. The wiring structure of claim 7, wherein the central hole of the second dielectric layer tapers upward, and a first portion of the third dielectric layer in the central hole of the second dielectric layer tapers upward.

13. The wiring structure of claim 1, wherein a tapering direction of the conductive via is different from a tapering direction of the first portion of the second dielectric layer in the through hole of the first dielectric layer.

14. The wiring structure of claim 1, further comprising a second circuit layer disposed on the second dielectric layer and electrically isolated from the conductive via.

15. An assembly structure, comprising:
an upper wiring structure including:
a first dielectric layer defining at least one through hole;
a first circuit layer disposed on the first dielectric layer; and
a second dielectric layer disposed on the first dielectric layer to cover the first circuit layer, wherein a first portion of the second dielectric layer is disposed in the through hole of the first dielectric layer;
a lower wiring structure including at least one dielectric layer and at least one circuit layer in contact with the dielectric layer, and attached to the upper wiring structure; and
a conductive via extending through the upper wiring structure, and electrically connected to the circuit layer of the lower wiring structure.

16. The assembly structure of claim 15, wherein the upper wiring structure includes a plurality of circuit layers and at least one inner via disposed between two circuit layers for electrically connecting the two circuit layers, and a tapering direction of the inner via is different from a tapering direction of the conductive via.

17. The assembly structure of claim 15, further comprising an outer circuit layer disposed on a top surface of the upper wiring structure and electrically connected to the lower wiring structure through the conductive via.

18. The assembly structure of claim 17, further comprising a mask layer interposed between the outer circuit layer and the top surface of the upper wiring structure.

19. The assembly structure of claim 18, wherein the conductive via further extends through the mask layer.

20. The assembly structure of claim 15, wherein the conductive via extends through the first portion of the second dielectric layer in the through hole of the first dielectric layer of the upper wiring structure, and is electrically isolated from the first circuit layer of the upper wiring structure.

* * * * *